US007697487B2

(12) United States Patent
Castor et al.

(10) Patent No.: US 7,697,487 B2
(45) Date of Patent: Apr. 13, 2010

(54) PHYSICAL LAYER PROCESSING FOR A WIRELESS COMMUNICATION SYSTEM USING CODE DIVISION MULTIPLE ACCESS

(75) Inventors: Douglas R. Castor, Norristown, PA (US); George W. McClellan, Bensalem, PA (US); Joseph T. Morabito, Dix Hills, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

(21) Appl. No.: 12/354,514

(22) Filed: Jan. 15, 2009

(65) Prior Publication Data

US 2009/0122764 A1 May 14, 2009

Related U.S. Application Data

(63) Continuation of application No. 10/123,613, filed on Apr. 16, 2002, now Pat. No. 7,515,564.

(60) Provisional application No. 60/284,062, filed on Apr. 16, 2001.

(51) Int. Cl.
*H04B 7/216* (2006.01)

(52) U.S. Cl. ........................................ 370/335; 370/342

(58) Field of Classification Search ................. 370/335, 370/342, 336, 337, 441, 442, 479
See application file for complete search history.

(56) References Cited

U.S. PATENT DOCUMENTS 5,321,690 A 6/1994 Sato
5,838,733 A 11/1998 Bruckert (Continued)

FOREIGN PATENT DOCUMENTS

JP 60-77540 5/1985

(Continued)

OTHER PUBLICATIONS

"3rd Generation Partnership Project; Technical Specification Group Radio Access Network; Multiplexing and Channel Coding (TDD)", 3GPP TS 25.222, V3.4.0, Sep. 2000, Release 1999, pp. 1-37.

(Continued)

*Primary Examiner*—Brian D Nguyen
(74) *Attorney, Agent, or Firm*—Volpe and Koenig, P.C.

(57) ABSTRACT

The invention includes various embodiments for use in physical layer processing. One embodiment determines the address mapping of bits in the physical channel buffer from the address of bits in the first interleaver buffer. The physical channel buffer addresses are determined corresponding to addresses of the bits after rate matching, bit scrambling, second interleaving and physical channel mapping. The bits are directly read from the first interleaver buffer and written to the physical channel buffer using the determined physical channel buffer addresses. Another embodiment determines the address mapping of bits in the first interleaver buffer from the address of bits in the physical channel buffer. The first interleaver buffer addresses are determined corresponding to addresses of the bits after reverse rate matching, reverse bit scrambling, reverse second interleaving and reverse physical channel mapping. The bits are directly read from the determined first interleaver buffer addresses and written to the physical channel buffer addresses.

9 Claims, 24 Drawing Sheets

U.S. PATENT DOCUMENTS

| | | | | |
|---|---|---|---|---|
| 5,850,393 | A | 12/1998 | Adachi | |
| 6,182,265 | B1 | 1/2001 | Lim et al. | |
| 6,295,287 | B1 | 9/2001 | Prasad | |
| 6,397,367 | B1 | 5/2002 | Park et al. | |
| 6,400,703 | B1 | 6/2002 | Park et al. | |
| 6,456,611 | B1 | 9/2002 | Hu et al. | |
| 6,744,744 | B1 | 6/2004 | Tong et al. | |
| 6,993,699 | B2 | 1/2006 | Obuchi et al. | |
| 7,058,077 | B1 | 6/2006 | Guo et al. | |
| 2002/0062464 | A1 | 5/2002 | Park et al. | |
| 2002/0110101 | A1 * | 8/2002 | Gopalakrishnan et al. | 370/335 |
| 2002/0131385 | A1 | 9/2002 | Doetsch et al. | |
| 2002/0160782 | A1 * | 10/2002 | Joshi et al. | 455/452 |
| 2003/0035392 | A1 * | 2/2003 | Pan et al. | 370/335 |
| 2003/0043928 | A1 * | 3/2003 | Ling et al. | 375/267 |

FOREIGN PATENT DOCUMENTS

| | | |
|---|---|---|
| JP | 1-113440 | 7/1989 |
| JP | 05-506763 | 9/1993 |
| JP | 05-259978 | 10/1993 |
| JP | 08-130535 | 5/1996 |
| JP | 2000-138596 | 5/2000 |
| JP | 2001-057521 | 2/2001 |
| JP | 2002-152054 | 5/2002 |
| JP | 2002-288113 | 10/2002 |
| JP | 2006-060854 | 3/2006 |
| KR | 1998-0025564 | 2/1999 |
| KR | 1999-0078446 | 6/2001 |
| KR | 2002-0056441 | 7/2002 |
| WO | 01/03369 | 1/2001 |

OTHER PUBLICATIONS

Haardt et al., "The TD-CDMA Based UTRA TDD Mode," IEEE Journal on Selected Areas in Communications, vol. 18, No. *, (Aug. 2000).

3GPPP, "3rd Generation Partnership Project, Technical Specification Group Radio Access Network; Multiplexing and Channel Coding (TDD)," 3GPP TS 25.222 V3.2.0 (Mar. 2000).

3GPPP, "3rd Generation Partnership Project, Technical Specification Group Radio Access Network; Multiplexing and Channel Coding (TDD) (Release 1999)," 3GPP TS 25.222 V3.6.0 (Mar. 2001).

3GPPP, "3rd Generation Partnership Project, Technical Specification Group Radio Access Network; Multiplexing and Channel Coding (TDD) (Release 1999)," 3GPP TS 25.222 V3.8.0 (Mar. 2002).

3GPPP, "3rd Generation Partnership Project, Technical Specification Group Radio Access Network; Multiplexing and Channel Coding (TDD) (Release 4)," 3GPP TS 25.222 V4.0.0 (Mar. 2001).

3GPPP, "3rd Generation Partnership Project, Technical Specification Group Radio Access Network; Multiplexing and Channel Coding (TDD) (Release 4)," 3GPP TS 25.222 V4.3.0 (Mar. 2002).

3GPPP, "3rd Generation Partnership Project, Technical Specification Group Radio Access Network; Multiplexing and Channel Coding (TDD) (Release 5)," 3GPP TS 25.222 V5.0.0 (Mar. 2002).

3GPP, "3rd Generation Partnership Project; Technical Specification Group Radio Access Network; Spreading and modulation (FDD) (Release 1999)," 3GPP TS 25.213 V3.5.0 (Mar. 2001).

3GPP, "3rd Generation Partnership Project; Technical Specification Group Radio Access Network; Spreading and modulation (FDD) (Release 1999)," 3GPP TS 25.213 V3.7.0 (Dec. 2001).

3GPP, "3rd Generation Partnership Project; Technical Specification Group Radio Access Network; Spreading and modulation (FDD) (Release 4)," 3GPP TS 25.213 V4.0.0 (Mar. 2001).

3GPP, "3rd Generation Partnership Project; Technical Specification Group Radio Access Network; Spreading and modulation (FDD) (Release 4)," 3GPP TS 25.213 V4.2.0 (Dec. 2001).

* cited by examiner

INTERLEAVED ARRAY

| | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|
| | | | | | | 15 | | | | | | | | | | | | | | | | 27 | 8 | 20 | 5 | 17 | 28 | 11 | 23 |
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
| 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 |
| 60 | 61 | 62 | 63 | 64 | 65 | 66 | 67 | 68 | 69 | 70 | 71 | 72 | 73 | 74 | 75 | 76 | 77 | | | | | | | | | | | | |

INTERLEAVED ARRAY IN PERMUTED ORDER

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|---|---|---|---|---|---|---|---|---|---|---|---|---|---|---|
| | 0 | 20 | 10 | 5 | 15 | 25 | 3 | 13 | 23 | 8 | 18 | 28 | 1 | 11 | 21 | 6 | 16 | 26 | 4 | 14 | 24 | 19 | 9 | 29 | 12 | 2 | 7 | 22 | 27 | 17 |
| | 30 | 50 | 40 | 35 | 45 | 55 | 33 | 43 | 53 | 38 | 48 | 58 | 31 | 41 | 51 | 36 | 46 | 56 | 34 | 44 | 54 | 49 | 39 | 59 | 42 | 32 | 37 | 52 | 57 | 47 |
| | 60 | | 70 | 65 | 75 | | 63 | 73 | | 68 | | | 61 | 71 | | 66 | 76 | | 64 | 74 | | | 69 | | 72 | 62 | 67 | | | 77 |
| COL OFFSET | 0 | 3 | 5 | 8 | 11 | 14 | 16 | 19 | 22 | 24 | 27 | 29 | 31 | 34 | 37 | 39 | 42 | 45 | 47 | 50 | 53 | 55 | 57 | 60 | 62 | 65 | 68 | 71 | 73 | 75 |

OUTPUT ORDER 0 30 60 20 50 10 ... ... 27 57 17 47 77

| | |
|---|---|
| BIT | 58 |
| ROW | 58 / 30 = 1 |
| COLUMN OFFSET | 29 |
| INTERLEAVED POSITION | 29 + 1 = 30 |

FIG. 10

| | 0 | 1 | 2 | 3 | | 14 | 15 | 16 | 17 | 18 | | 223 | 224 | 225 | 226 | 227 | 228 | | | 239 | 240 | 241 | 242 | 243 |
|---|---|---|---|---|---|---|---|---|---|---|---|---|---|---|---|---|---|---|---|---|---|---|---|---|
| RU 1 | 0 | 3 | 6 | 9 | ••• | 42 | 45 | 48 | 51 | 54 | ••• | 669 | 672 | 675 | 678 | 681 | | | | | | | | |
| RU 2 | 714 | 712 | 710 | 708 | ••• | 686 | 684 | 682 | 679 | 676 | ••• | 61 | 58 | 55 | 52 | 49 | 46 | •• | | 13 | 10 | 7 | 4 | 1 |
| RU 3 | 2 | 5 | 8 | 11 | ••• | 44 | 47 | 50 | 53 | 56 | ••• | 671 | 674 | 677 | 680 | 683 | 685 | ••• | | 707 | 709 | 711 | 713 | 715 |

ADDRESSES

| RU | BASE | END | DIRECTION |
|---|---|---|---|
| 1 | 1000 | 1227 | F |
| 2 | 2000 | 2243 | R |
| 3 | 3000 | 3243 | F |

INTERNAL VARIABLES

| | | |
|---|---|---|
| SWITCHPOINT | 228*3 | 684 |
| | BEFORE SWITCHPOINT | AFTER SWITCHPOINT |
| MODULES | 3 | 2 |

EXAMPLE CALCULATIONS

| BIT | MODULUS | RU | ADDRESS | CALCULATION |
|---|---|---|---|---|
| 681 | 3 | 1 | 1227 | START + BITNUMBER / MODULUS |
| 682 | 3 | 2 | 2016 | END - BITNUMBER / MODULUS |
| 683 | 3 | 3 | 3227 | START + BITNUMBER / MODULUS |
| 684 | 2 | 2 | 2015 | END - SWITCHPOINT / ( MODULUS + 1 ) - ( BITNUMBER - SWITCHPOINT ) / MODULUS - 1 |
| 685 | 2 | 3 | 3228 | START + SWITCHPOINT / ( MODULUS + 1 ) + (BITNUMBER - SWITCHPOINT ) / MODULUS |
| 712 | 2 | 2 | 2001 | END - SWITCHPOINT / ( MODULUS + 1 ) + (BITNUMBER - SWITCHPOINT ) / MODULUS -1 |
| 713 | 2 | 3 | 3242 | START + SWITCHPOINT / ( MODULUS + 1 ) + ( BITNUMBER - SWITCHPOINT ) / MODULUS |
| 714 | 2 | 2 | 2000 | END - SWITCHPOINT / ( MODULUS + 1 ) - ( BITNUMBER - SWITCHPOINT ) / MODULUS |
| 715 | 2 | 3 | 3243 | START + SWITCHPOINT / ( MODULUS + 1 ) + ( BITNUMBER - SWITCHPOINT ) / MODULUS |

FIG. 12

2 RUs 960+244 BITS (16 TFCI BITS INSERTED LATER)

| | 0 | 1 | | 61 | 62 | 63 | 64 | 65 | 66 | 67 | 68 | 69 | 70 | 71 | | 224 | 225 | 226 | 227 | 972 | 973 | 974 | 975 |
|---|---|---|---|---|---|---|---|---|---|---|---|---|---|---|---|---|---|---|---|---|---|---|---|
| RU 1 | 0 | 5 | | | | | | | | | | | | | | 1120 | 1125 | 1130 | 1135 | | | | |
| RU 2 | 1203 | 1202 | | 1142 | 1141 | 1140 | 1139 | 1138 | 1137 | 1136 | 1134 | 1133 | 1132 | 1131 | | | | | | 4 | 3 | 2 | 1 |

ADDRESSES

| RU | BASE | END | DIRECTION |
|---|---|---|---|
| 1 | 1000 | 1243 | F |
| 2 | 2000 | 2975 | R |

INTERNAL VARIABLES

| | | |
|---|---|---|
| SWITCHPOINT | 5*228 | 1140 |
| | BEFORE SWITCHPOINT | BEFORE SWITCHPOINT |
| MODULES | 5 | 4 |

EXAMPLE CALCULATIONS

| BIT | MODULUS | RU | ADDRESS | CALCULATION |
|---|---|---|---|---|
| 0 | 5 | 1 | 1000 | START+BITNUMBER/MODULUS |
| 1 | 5 | 2 | 2975 | END-((MODULUS-1)*(BITNUMBER/MODULUS))-BITNUMBER % MODULUS |
| 2 | 5 | 2 | 2974 | END-((MODULUS-1)*(BITNUMBER/MODULUS))-BITNUMBER % MODULUS |
| 3 | 5 | 2 | 2973 | END-((MODULUS-1)*(BITNUMBER/MODULUS))-BITNUMBER % MODULUS |
| 4 | 5 | 2 | 2972 | END-((MODULUS-1)*(BITNUMBER/MODULUS))-BITNUMBER % MODULUS |
| 5 | 5 | 1 | 1001 | START+BITNUMBER/MODULUS |
| 1135 | 5 | 1 | 1227 | START+BITNUMBER/MODULUS |
| 1136 | 5 | 2 | 2067 | END-((MODULUS-1)*(BITNUMBER/MODULUS))-BITNUMBER % MODULUS |
| 1137 | 5 | 2 | 2066 | END-((MODULUS-1)*(BITNUMBER/MODULUS))-BITNUMBER % MODULUS |
| 1138 | 5 | 2 | 2065 | END-((MODULUS-1)*(BITNUMBER/MODULUS))-BITNUMBER % MODULUS |
| 1139 | 5 | 2 | 2064 | END-((MODULUS-1)*(BITNUMBER/MODULUS))-BITNUMBER % MODULUS |
| 1140 | 4 | 2 | 2063 | END-MODULUS*SWITCHPOINT/(MODULUS+1)-(BITNUMBER-SWITCHPOINT) |
| 1141 | 4 | 2 | 2062 | END-MODULUS*SWITCHPOINT/(MODULUS+1)-(BITNUMBER-SWITCHPOINT) |
| 1142 | 4 | 2 | 2061 | END-MODULUS*SWITCHPOINT/(MODULUS+1)-(BITNUMBER-SWITCHPOINT) |
| 1202 | 4 | 2 | 2001 | END-MODULUS*SWITCHPOINT/(MODULUS+1)-(BITNUMBER-SWITCHPOINT) |
| 1203 | 4 | 2 | 2000 | END-MODULUS*SWITCHPOINT/(MODULUS+1)-(BITNUMBER-SWITCHPOINT) |

FIG. 13

2 RUs 960 + 244 BITS ( 16 TFCI BITS INSERTED LATER )

| | | | | | | | | | | | | | | | | | | | | | | |
|---|---|---|---|---|---|---|---|---|---|---|---|---|---|---|---|---|---|---|---|---|---|---|
| | 0 | 1 | 2 | 3 | 4 | 5 | 6 | 7 | | 240 | 241 | 242 | 243 | | 952 | 953 | 954 | 955 | 956 | 957 | 958 | 959 |
| RU 1 | 0 | 1 | 2 | 3 | 5 | 6 | 7 | 8 | | | | | | | 1190 | 1191 | 1192 | 1193 | 1195 | 1196 | 1197 | 1198 |
| RU 2 | 1203 | 1202 | 1201 | 1200 | 1199 | 1194 | 1189 | 1184 | | 19 | 14 | 9 | 4 | | | | | | | | | |

ADDRESSES

| RU | BASE | END | DIRECTION |
|---|---|---|---|
| 1 | 1000 | 1959 | F |
| 2 | 2000 | 2243 | R |

INTERNAL VARIABLES

| | | |
|---|---|---|
| SWITCHPOINT | 5*960 / 5 | 1200 |
| | BEFORE SWITCHPOINT | BEFORE SWITCHPOINT |
| MODULES | 5 | 4 |

EXAMPLE CALCULATIONS

| BIT | MODULUS | RU | ADDRESS | CALCULATION |
|---|---|---|---|---|
| 0 | 5 | 1 | 1000 | START + (( MODULUS - 1 ) * ( BITNUMBER / MODULUS )) + BITNUMBER%MODULUS |
| 1 | 5 | 1 | 1001 | START + (( MODULUS - 1 ) * ( BITNUMBER / MODULUS )) + BITNUMBER%MODULUS |
| 2 | 5 | 1 | 1002 | START + (( MODULUS - 1 ) * ( BITNUMBER / MODULUS )) + BITNUMBER%MODULUS |
| 3 | 5 | 1 | 1003 | START + (( MODULUS - 1 ) * ( BITNUMBER / MODULUS )) + BITNUMBER%MODULUS |
| 4 | 5 | 2 | 2243 | END - BITNUMBER / MODULUS |
| 5 | 5 | 1 | 1004 | START + (( MODULUS - 1 ) * ( BITNUMBER / MODULUS )) + BITNUMBER%MODULUS |
| 1194 | 5 | 2 | 2005 | END - BITNUMBER / MODULUS |
| 1195 | 5 | 1 | 1956 | START + (( MODULUS - 1 ) * ( BITNUMBER / MODULUS )) + BITNUMBER%MODULUS |
| 1196 | 5 | 1 | 1957 | START + (( MODULUS - 1 ) * ( BITNUMBER / MODULUS )) + BITNUMBER%MODULUS |
| 1197 | 5 | 1 | 1958 | START + (( MODULUS - 1 ) * ( BITNUMBER / MODULUS )) + BITNUMBER%MODULUS |
| 1198 | 5 | 1 | 1959 | START + (( MODULUS - 1 ) * ( BITNUMBER / MODULUS )) + BITNUMBER%MODULUS |
| 1199 | 5 | 2 | 2004 | END - BITNUMBER / MODULUS |
| 1200 | 4 | 2 | 2003 | END - SWITCHPOINT / ( MODULES + 1 ) - ( BITNUMBER - SWITCHPOINT ) |
| 1201 | 4 | 2 | 2002 | END - SWITCHPOINT / ( MODULES + 1 ) - ( BITNUMBER - SWITCHPOINT ) |
| 1202 | 4 | 2 | 2001 | END - SWITCHPOINT / ( MODULES + 1 ) - ( BITNUMBER - SWITCHPOINT ) |
| 1203 | 4 | 2 | 2000 | END - SWITCHPOINT / ( MODULES + 1 ) - ( BITNUMBER - SWITCHPOINT ) |

FIG. 14

| | 0 | 1 | 2 | 3 | | 14 | 15 | 16 | 17 | 18 | | 223 | 224 | 225 | 226 | 227 | 228 | | | 239 | 240 | 241 | 242 | 243 |
|---|---|---|---|---|---|---|---|---|---|---|---|---|---|---|---|---|---|---|---|---|---|---|---|---|
| RU 1 | 0 | 3 | 6 | 9 | ••• | 42 | 45 | 48 | 51 | 54 | ••• | 669 | 672 | 675 | 678 | 681 | | | | | | | | |
| RU 2 | 714 | 712 | 710 | 708 | ••• | 686 | 684 | 682 | 679 | 676 | ••• | 61 | 58 | 55 | 52 | 49 | 46 | ••• | | 13 | 10 | 7 | 4 | 1 |
| RU 3 | 2 | 5 | 8 | 11 | ••• | 44 | 47 | 50 | 53 | 56 | ••• | 671 | 674 | 677 | 680 | 683 | 685 | 687 | ••• | 707 | 709 | 711 | 713 | 715 |

EXAMPLE CALCULATIONS

| RU | ruX | MODULUS | DIR | SP | FORMULA | ORIG BIT |
|---|---|---|---|---|---|---|
| 1 | 227 | 3 | F | 228 | ruX * MODULUS + ( ru % MODULUS ) | 681 |
| 2 | 243 | 3 | R | 228 | (END - ruX) * MOD + 1 REV BEFORE SWITCH | 1 |
| 2 | 16 | 3 | R | 228 | | 682 |
| 2 | 15 | 3 | R | 228 | SP * MOD - (END - SP - ruX) * (MOD-1) + RU - 2 REV AFTER SWITCH | 684 |
| 2 | 14 | 3 | R | 228 | | 686 |
| 2 | 0 | 3 | R | 228 | | 714 |
| 3 | 0 | 3 | R | 228 | ruX * MODULUS + ( ru % MODULUS ) | 2 |
| 3 | 227 | 3 | R | 228 | | 683 |
| 3 | 228 | 3 | R | 228 | SP * MODULUS + ( ruX - SP ) * ( MOD - 1 ) | 685 |
| 3 | 229 | 3 | R | 228 | | 687 |
| 3 | 243 | 3 | R | 228 | | 715 |

FIG. 18

2 RUs 228 + 976 BITS ( 16 TFCI BITS INSERTED LATER )

| | 0 | 1 | | 61 | 62 | 63 | 64 | 65 | 66 | 67 | 68 | 69 | 70 | 71 | | 224 | 225 | 226 | 227 | 972 | 973 | 974 | 975 |
|---|---|---|---|---|---|---|---|---|---|---|---|---|---|---|---|---|---|---|---|---|---|---|---|
| RU 1 | 0 | 5 | | | | | | | | | | | | | | 1120 | 1125 | 1130 | 1135 | | | | |
| RU 2 | 1200 | 1202 | | 1142 | 1141 | 1140 | 1139 | 1138 | 1137 | 1136 | 1134 | 1133 | 1132 | 1131 | | | | | | 4 | 3 | 2 | 1 |

EXAMPLE CALCULATIONS

SPFORWARD 228 SPREVERSE 64 LASTPOINT2 975 MODULUS 5 MOD - 1 4

| RU | ruPOS | DIR | FORMULA | ORIG BIT |
|---|---|---|---|---|
| 1 | 0 | F | | 0 |
| 1 | 1 | F | MOD * ruPOS | 5 |
| 1 | 227 | F | FORWARD BEFORE SWITCH | 1135 |
| 2 | 0 | R | | 1203 |
| 2 | 1 | R | | 1202 |
| 2 | 61 | R | MOD * SPF + SPR - ruPOS - 1 | 1142 |
| 2 | 62 | R | REVERSE AFTER SWITCH | 1141 |
| 2 | 63 | R | | 1140 |
| 2 | 64 | R | | 1139 |
| 2 | 65 | R | | 1138 |
| 2 | 66 | R | | 1137 |
| 2 | 67 | R | MOD * INT ( LP2 - C19 / MOD MINUS 1 ) + MOD ( LP2 - C19 MOD MINUS 1 ) + 1 | 1136 |
| 2 | 972 | R | REVERSE BEFORE SWITCH | 4 |
| 2 | 973 | R | | 3 |
| 2 | 974 | R | | 2 |
| 2 | 975 | R | | 1 |

FIG. 19

2 RUs 960 + 244 BITS ( 16 TFCI BITS INSERTED LATER )

| | 0 | 1 | 2 | 3 | 4 | 5 | 6 | 7 | | 240 | 241 | 242 | 243 | | 952 | 953 | 954 | 955 | 956 | 957 | 958 | 959 |
|---|---|---|---|---|---|---|---|---|---|---|---|---|---|---|---|---|---|---|---|---|---|---|
| RU 1 | 0 | 1 | 2 | 3 | 5 | 6 | 7 | 8 | | | | | | | 1190 | 1191 | 1192 | 1193 | 1195 | 1196 | 1197 | 1198 |
| RU 2 | 1203 | 1202 | 1201 | 1200 | 1199 | 1194 | 1189 | 1184 | | 19 | 14 | 9 | 4 | | | | | | | | | |

EXAMPLE CALCULATIONS

SPREVERSE 4 LASTPOINT2 243 MODULUS 5 MOD - 1 4

4

| RU | ruPOS | MODULUS | DIR | SP | FORMULA | ORIG BIT |
|---|---|---|---|---|---|---|
| 1 | 0 | | F | | | 0 |
| 1 | 1 | | F | | | 1 |
| 1 | 2 | | F | | | 2 |
| 1 | 3 | | F | | | 3 |
| 1 | 4 | | F | | | 5 |
| 1 | 5 | | F | | MOD * INT (ruPOS / ( MOD - 1 ) + ruPOS % ( MOD - 1 ) FORWARD BEFORE SWITCH | 6 |
| 1 | 952 | | F | | | 1190 |
| 1 | 953 | | F | | | 1191 |
| 1 | 954 | | F | | | 1192 |
| 1 | 959 | | F | | | 1198 |
| 2 | 0 | 5 | R | 228 | | 1203 |
| 2 | 1 | 5 | R | 228 | MOD * ( LP2 - SPR + 1 ) + (LP2 - ruPOS ) % MOD MINUS 1 REVERSE AFTER SWITCH | 1202 |
| 2 | 2 | 5 | R | 228 | | 1201 |
| 2 | 3 | 5 | R | 228 | | 1200 |
| 2 | 4 | | R | | | 1199 |
| 2 | 5 | | R | | | 1194 |
| 2 | 6 | | R | | | 1189 |
| 2 | 7 | | R | | MOD * ( LP2 - ruPOS ) + ( MOD MINUS 1 ) REVERSE BEFORE SWITCH | 1184 |
| 2 | 240 | | R | | | 19 |
| 2 | 241 | | R | | | 14 |
| 2 | 242 | | R | | | 9 |
| 2 | 243 | | R | | | 4 |

FIG. 20

INTERLEAVED ARRAY

| 0 | 12 | 25 | 6 | 18 | 3 | 15 | 26 | 9 | 22 | 2 | 13 | 24 | 7 | 19 | 4 | 16 | 29 | 10 | 21 | 1 | 14 | 27 | 8 | 20 | 5 | 17 | 28 | 11 | 23 |
|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
| 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 |
| 60 | 61 | 62 | 63 | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 |
| 90 | 91 | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 |
| 120 | 121 | 122 | 123 | 124 | 125 | 126 | 127 | 128 | 129 | 130 | 131 | 132 | 133 | 134 | 135 | 136 | 137 | 138 | 139 | 140 | 141 | 142 | 143 | 144 | 145 | 146 | 147 | 148 | 149 |

INTERLEAVED ARRAY IN PERMUTED ORDER

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|---|---|---|---|---|---|---|---|---|---|---|---|---|---|---|
| | 0 | 20 | 10 | 5 | 15 | 25 | 3 | 13 | 23 | 8 | 18 | 28 | 1 | 11 | 21 | 6 | 16 | 26 | 4 | 14 | 24 | 19 | 9 | 29 | 12 | 2 | 7 | 22 | 27 | 17 |
| | 30 | 50 | 40 | 35 | 45 | 55 | 33 | 43 | 53 | 38 | 48 | 58 | 31 | 41 | 51 | 36 | 46 | 56 | 34 | 44 | 54 | 49 | 39 | 59 | 42 | 32 | 37 | 52 | 57 | 47 |
| | 60 | 80 | 70 | 65 | 75 | 85 | 63 | 73 | 83 | 68 | 78 | 88 | 61 | 71 | 81 | 66 | 76 | 88 | 64 | 74 | 84 | 79 | 69 | 89 | 72 | 62 | 67 | 82 | 87 | 77 |
| | 120 | 140 | 130 | 125 | 135 | 145 | 123 | 133 | 143 | 128 | 138 | 148 | 121 | 131 | 141 | 126 | 136 | 146 | 124 | 134 | 144 | 139 | 129 | 149 | 132 | 122 | 127 | 142 | 147 | 137 |
| | 150 | | | | | | | | | | | | | | | | | | | | | | | | | | | | | |
| OFFSET | 0 | 6 | 11 | 16 | 21 | 26 | 31 | 36 | 41 | 46 | 51 | 56 | 61 | 66 | 71 | 76 | 81 | 86 | 91 | 96 | 101 | 106 | 111 | 116 | 121 | 126 | 131 | 136 | 141 | 146 |
| IL COLUMN | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
| COLUMN | 0 | 20 | 10 | 5 | 15 | 25 | 3 | 13 | 23 | 8 | 18 | 28 | 1 | 11 | 21 | 6 | 16 | 26 | 4 | 14 | 24 | 19 | 9 | 29 | 12 | 2 | 7 | 22 | 27 | 17 |

| | | |
|---|---|---|
| THE RU BIT POS | 61 | |
| START OF COLUMN | 61 | SEARCH THROUGH COLOFFSETS |
| INTERLEAVED COLUMN | 12 | |
| REAL COLUMN | 1 | PERM |
| ROW | 1 | POS-COLOFFSET |
| THE BIT | 1 | (ROW-1)*30+REAL COLUMN |

FIG. 22

PHYSICAL LAYER PROCESSING FOR A WIRELESS COMMUNICATION SYSTEM USING CODE DIVISION MULTIPLE ACCESS

CROSS REFERENCE TO RELATED APPLICATIONS

This application is a continuation of U.S. patent application Ser. No. 10/123,613, filed Apr. 16, 2002, now U.S. Pat. No. 7,515,564, which claims priority from U.S. Provisional Patent Application No. 60/284,062, filed on Apr. 16, 2001.

BACKGROUND

The invention generally relates to wireless time division duplex (TDD) communication systems using code division multiple access (CDMA). In particular, the invention relates to processing data at the physical layer for such systems.

In CDMA communication systems, communications are transmitted in the same frequency spectrum over a wireless air interface, distinguished by their channelization codes. To further increase the utilization of the spectrum, CDMA/TDD communication systems time divide the spectrum into repeating frames having a fixed number of time slots, such as fifteen (15) time slots per frame. In TDD, each time slot is only used exclusively for the uplink or downlink.

Prior to transmission, data for transfer over the air interface is processed by the Universal Mobile Telecommunications System (UMTS) Terrestrial Radio Access Network (UTRAN). A simplified wireless communication system is illustrated in FIG. 1. Wireless users (user equipments) 38$_1$-38$_N$ (38) communicate with base stations 36$_1$-36$_N$ (36). Typically, a Node-B 34$_1$-34$_N$ (34) controls a group of base stations 36. A radio network controller (RNC) 32$_1$-32$_N$ (32) controls a group of Node-Bs 34. The RNCs 32, Node-Bs 34 and other associated components are part of the UTRAN 30. The UTRAN 30 communicates to other users through the core network 40.

Data processing within the UTRAN 30 is standardized, such as by the third Generation Partnership Project (3GPP), UMTS terrestrial radio access (UTRA) TDD system. The UTRAN 30 processes transport channels for transfer over the air interface. FIG. 2 is a block diagram of this UTRAN processing.

Transport blocks arrive for transport over the air interface. The transport blocks arrive in sets (transport block sets). The sets are received in a specified time interval (transmission time interval (TTI)). For 3GPP UTRA TDD, the possible TTI lengths are 10 ms, 20 ms, 40 ms and 80 ms, which correspond to 1, 2, 4 and 8 radio frames. respectively.

A circular redundancy code (CRC) attachment block 42 attaches CRC bits to each transport block. The CRC bits are used for error detection at the receiver. The CRC bit length is signaled from higher layers.

The transport blocks (TrBks) are serially concatenated by the TrBk concatenation/code block segmentation block 44. If the number of bits of the concatenated blocks is larger than the maximum size allowed for a code block, the concatenated blocks are segmented. The size of the code blocks is based on the type of error correction coding to be used, such as convolutional coding (maximum of 504 bits), turbo coding (maximum of 5114 bits) or no coding (unlimited). The concatenated blocks are segmented into a minimum number of equal sized segments (code blocks). If the original number of concatenated bits is not an even multiple of the minimum number of segments, filler bits are used to assure the segments are of equal size.

A channel coding block 46 error correction encodes the code blocks, such as by convolutional coding, turbo coding or no coding. After encoding, the code blocks are concatenated together. If the concatenated code blocks can not be segmented into a minimum number of equal sized segments (frames), Radio Frame equalization is performed by concatenating additional arbitrary bits.

A first interleaver 48 interleaves all the concatenated data. Subsequently, the interleaved data is segmented into radio frames by a radio frame segmentation block 50. A rate matching block 52 punctures or repeats bits. The puncturing and repeating assures data transmitted on each physical channel (resource unit) equals the maximum bit rate for that channel. The rate matching attributes for each transport channel (TrCH) is signaled by higher layers.

The TrCH multiplexing block 54 receives one frame's data for each transport channel. The received data for each TrCH is serially multiplexed onto a coded composite transport channel (CCTrCH). A bit scrambling block 56 scrambles the CCTrCH bits.

A physical channel block 58 maps the scrambled data onto the physical channels. A second interleaver 60 interleaves the scramble data over the entire radio frame or over each time slot. Higher layers dictate the type of interleaving utilized. After second interleaving, the interleaved data is segmented into the physical channels for transport over the air interface by a physical channel mapping block 62. The physical channel data is subsequently transmitted, such as from a base station 36 or UE 38. At the receiver, such as at a UE 38 or base station 36, the same process is performed in reverse to recover the transmitted data.

To process data as shown in FIG. 2, various levels of buffering (buffers 64, 66, 68, 70, 72) are required, such as after the first interleaver 48, the rate matching block 52, the transport channel multiplexing block 68, the bit scrambling block 56 and the second interleaver 60. This extensive buffering is undesirable. It requires heavy memory utilization and additional application specific integrated circuit (ASIC) space for memory to accommodate the buffering.

Accordingly, it is desirable to have alternate data processing schemes.

SUMMARY

The invention includes various embodiments for use in physical layer processing. One embodiment determines the address mapping of bits in the physical channel buffer from the address of bits in the first interleaver buffer. The physical channel buffer addresses are determined corresponding to addresses of the bits after rate matching, bit scrambling, second interleaving and physical channel mapping. The bits are directly read from the first interleaver buffer and written to the physical channel buffer using the determined physical channel buffer addresses. Another embodiment determines the address mapping of bits in the first interleaver buffer from the address of bits in the physical channel buffer. The first interleaver buffer addresses are determined corresponding to addresses of the bits after reverse rate matching, reverse bit scrambling, reverse second interleaving and reverse physical channel mapping. The bits are directly read from the determined first interleaver buffer addresses and written to the physical channel buffer addresses.

BRIEF DESCRIPTION OF THE DRAWING(S)

FIG. 10 is an example of "push" second interleaving.

FIG. 12 is an example of "push" physical channel mapping for case 2.

FIG. 13 is an example of "push" physical channel mapping for case 3.

FIG. 14 is an example of "push" physical channel mapping for case 4.

FIG. 18 is an example of "pull" reverse physical channel mapping for case 2.

FIG. 19 is an example of "pull" reverse physical channel mapping for case 3.

FIG. 20 is an example of "pull" reverse physical channel mapping for case 4.

FIG. 22 is an example of "pull" reverse second interleaving.

DETAILED DESCRIPTION OF THE PREFERRED EMBODIMENT(S)

Although the preferred embodiments are explained in context of the preferred application in a 3GPP UTRA TDD communication system, the embodiments are applicable to other standards, such as code division multiple access 2000 (CDMA2000), time division synchronous code division multiple access (TDSCDMA) and frequency division duplex code division multiple access (FDD/CDMA), and applications. The preferred embodiments are described in three general approaches: a "push", "pull" and "reduced first interleaver buffering" approach. However, the embodiments of the engines for each approach may be adapted for use in the other approaches or other applications.

Figure 3:
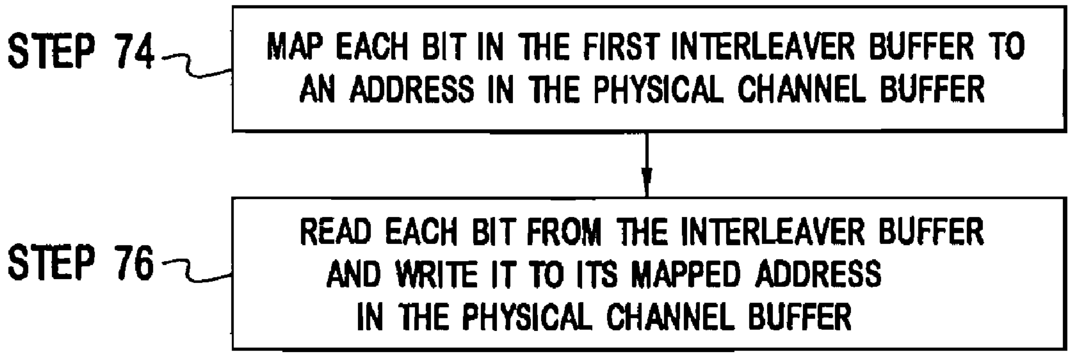
FIG. 3 is a flow chart for the "push" approach.
Figure 2:
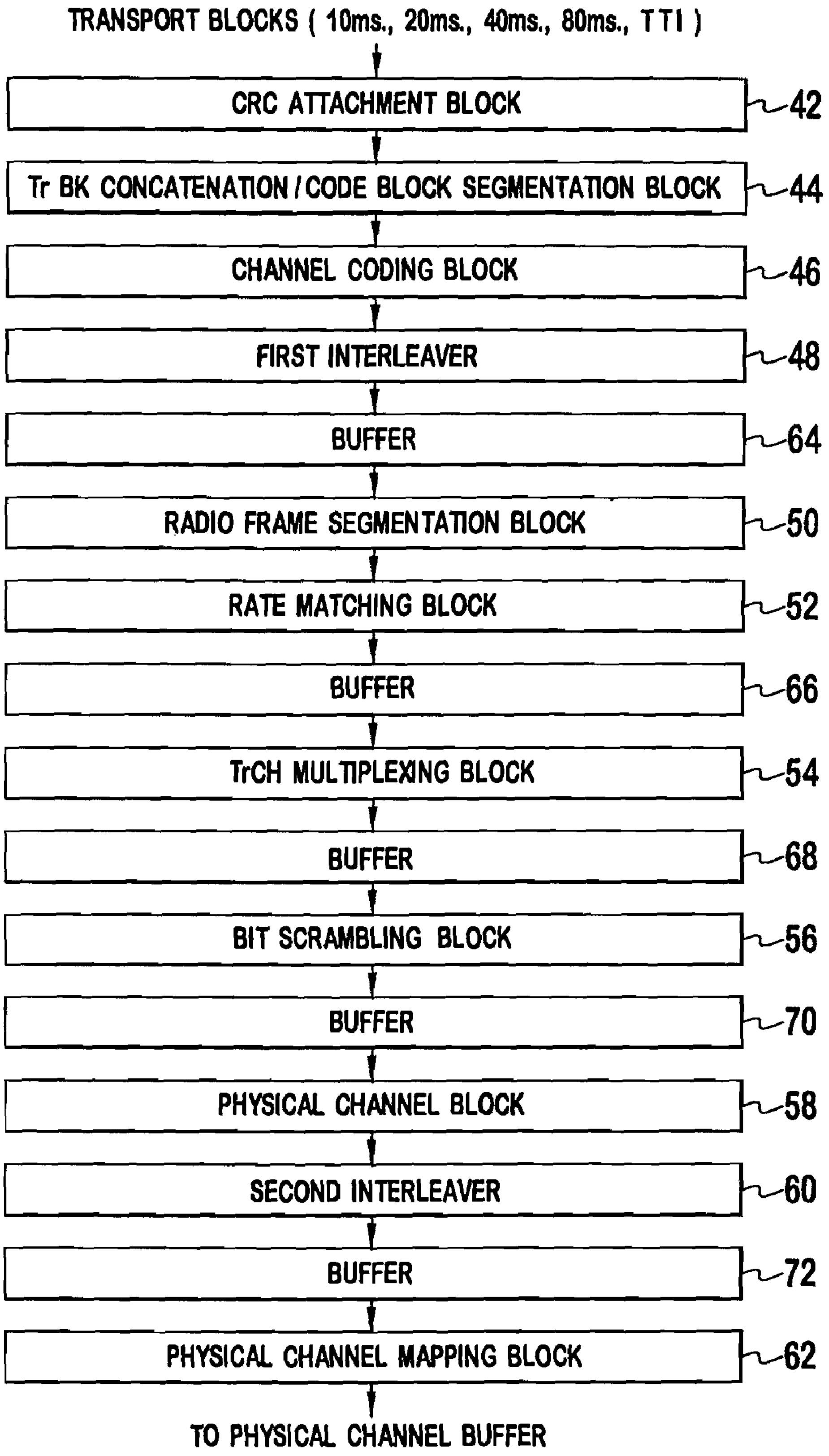
FIG. 2 is an illustration of physical layer processing.
Figure 4:
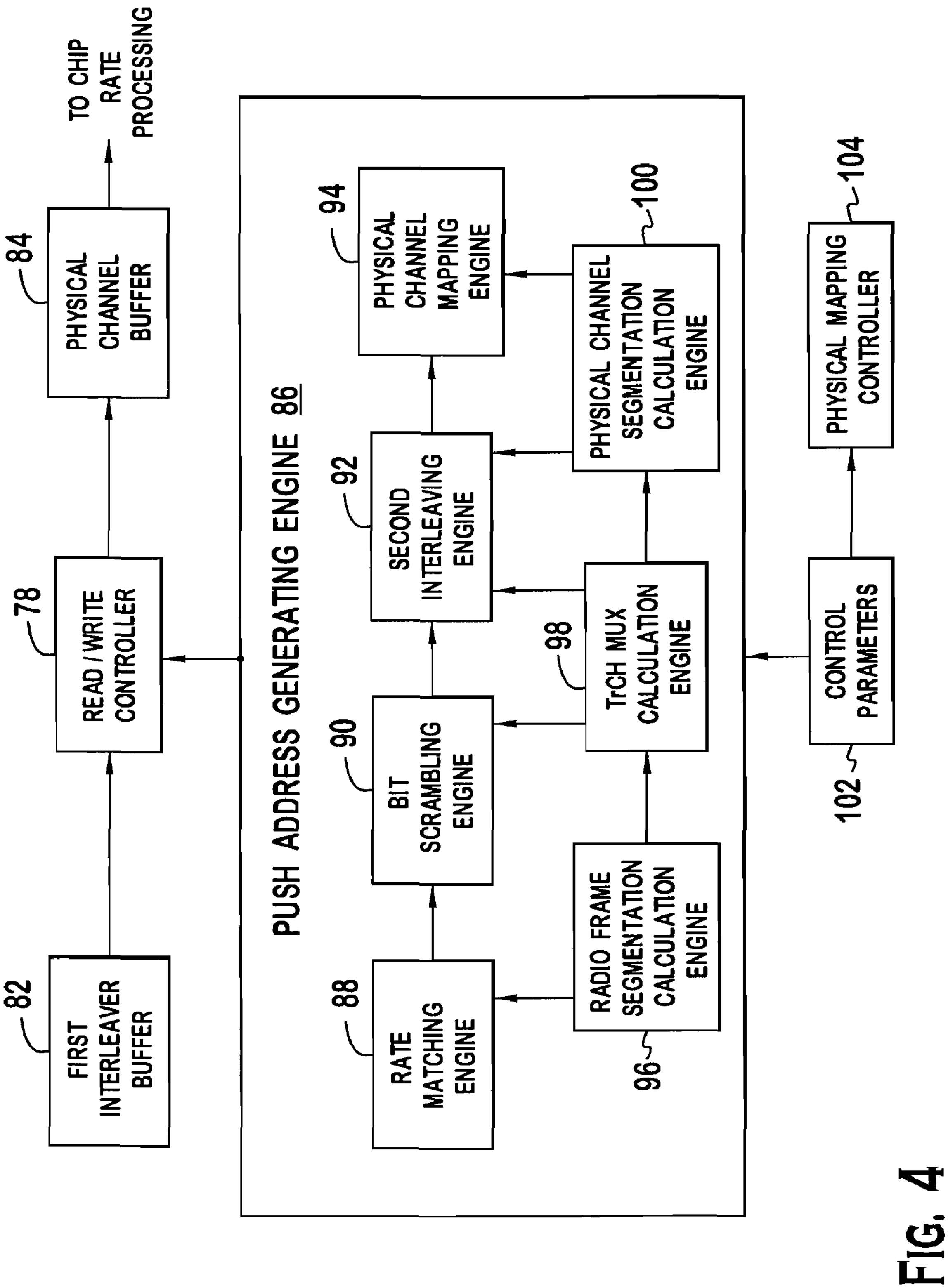
FIG. 4 is a simplified diagram of an embodiment of the "push" approach.

One approach to physical channel processing is referred to as the "push" approach, as shown in the flow chart of FIG. 3 and the block diagram of FIG. 4. In the "push" approach on the transmit side, each bit output from the first interleaver output buffer 82 is mapped (step 74) and written (step 76) to a bit of a physical channel buffer 84. Data in the physical channel buffer 84 is sent to chip rate processing for transmission over the air interface. To illustrate, a given bit of the first interleaver buffer 82 is mapped to no location, one location or multiple locations in the physical channel buffer 84, as shown in FIG. 4. After the bit is mapped, it is inserted into the physical channel buffer 84 in the corresponding locations. On the receive side, bits are read from the physical channel buffer 84 and written to the first interleaver buffer 82. As a result, the transmit side "push" approach is performed in the reverse order of the "push" approach on the receive side. In the following, the "push" approach is primarily described from the transmit side. The receive side is performed in an analogous reverse order.

FIG. 4 is a block diagram of an embodiment of the push approach. For bits in the first interleaver buffer 82, a push address generating engine 86 determines its destination address in a resource unit of the physical channel buffer 84. One frame's worth of bits are processed at a time. If the TTI is greater than 10 ms, the other frames bits are taken sequentially after the first frame, such as from frame 1 to frame 2 to frame 3 and so on. The bits may be taken one at a time or in groups, such 8 bits, 16 bits or 32 bits. The push address generating engine 86 determines the one, multiple or no address to write each bit to in the physical channel buffer 84. The push address generating engine 86 uses control parameters, which are either standardized or signaled, to determine the proper address.

The push address generating engine 86 sends a control signal to a read/write controller 78. The read/write controller 78 reads a bit or bits from the corresponding address in the first interleaver buffer 82 and writes bit/bits to the address or addresses as directed by the push address generating engine 86. All of these operations are controlled by the physical mapping controller 104, which also uses the control parameters to oversee the physical layer processing operation.

The push address generating engine 86 has four primary sub-engines: a rate matching engine 88, a bit scrambling engine 90, a second interleaving engine 92 and a physical channel mapping engine 94.

Three other sub-engines feed information to the four primary engines: a radio frame segmentation calculation engine 96, a TRCH multiplexing (MUX) calculation engine 98 and a physical channel segmentation calculation engine 100. These three sub-engines do not functionally change the order of bits during physical layer processing. These engines effectively mark bits.

Figure 1:
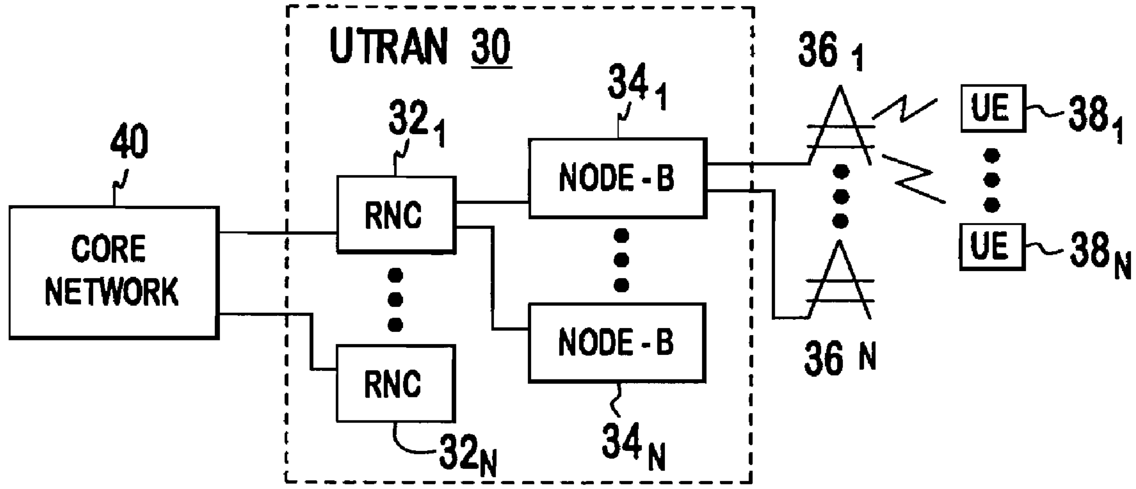
FIG. 1 is an illustration of a wireless TDD/CDMA communication system.

The radio frame segmentation engine 96 determines which bit addresses of the first interleaver buffer 82 are to be sent in each frame. The TrCH MUX engine 98 determines which of that frames data is sent in which CCTrCH. The physical channel segmentation engine 100 determines which bits of the CCTrCH are sent in which physical channel (resource unit). Although these three engines 96, 98, 100 are shown in FIG. 1 as being functionally performed immediately prior to the step requiring the information, they may actually be performed earlier and, possibly, prior to operation of any of the primary engines 88, 90, 92, 94.

The four primary engines 88, 90, 92, 94 operate in the order indicated in FIG. 3 on the transmit side. Rate matching is performed first. Subsequently, bit scrambling is performed, followed by second interleaving. Finally, physical channel mapping is performed.

In rate matching, bits are punctured and repeated to both minimize the number of required channels and to assure each channel is fully utilized. To illustrate, if a channel has 110 bits in the first interleaver buffer, but the channel is required to have 100 bits due to the physical channel allocation. 10 bits are punctured. By contrast, if the same channel had only 90 bits in the buffer, 10 bits would need to be repeated. Due to puncturing and repeating, some first interleaver buffer bits may be written to no address, one address or multiple addresses.

Figure 5:
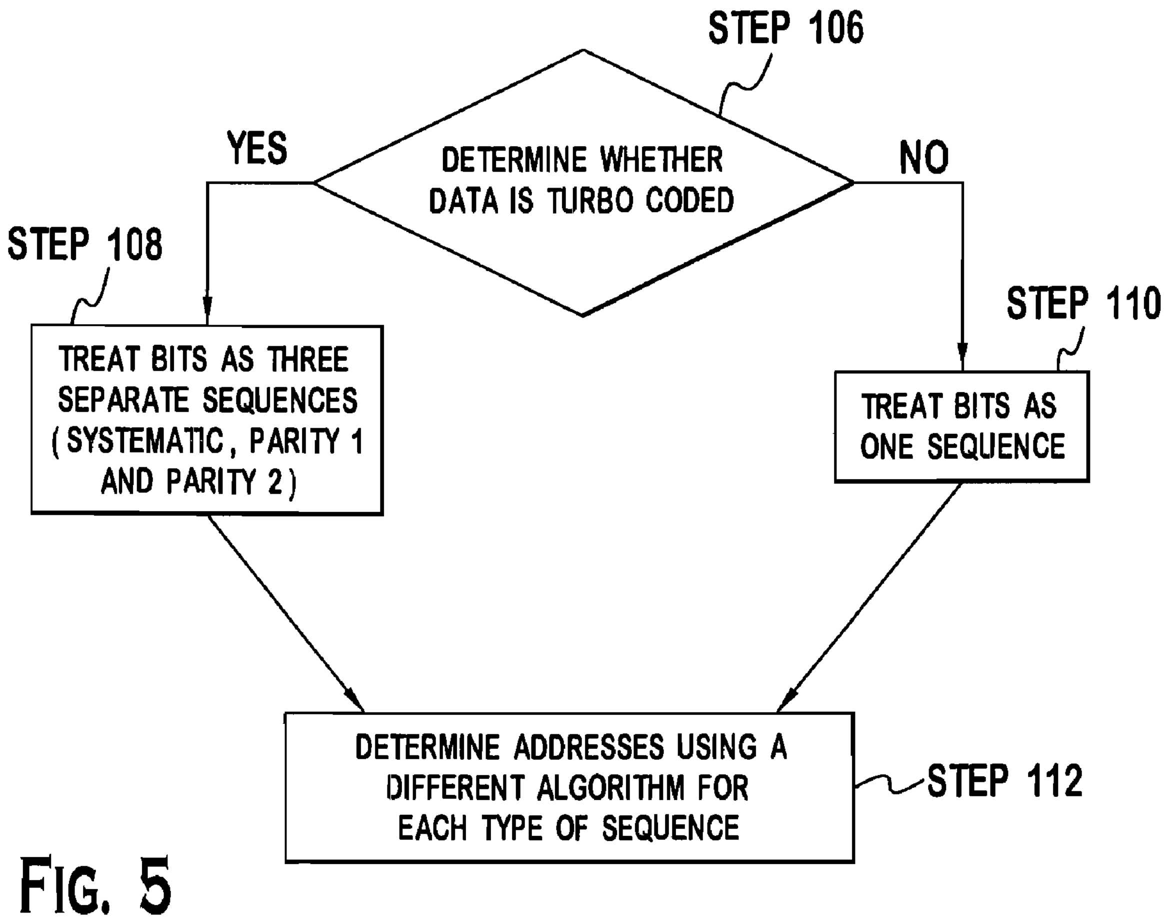
FIG. 5 is a flow chart for "push" rate matching.

The rate matching engine 88 determines addresses that each bit of the first interleaver buffer will be in after rate matching and is described using FIG. 5. Rate matching primarily uses three variables: e-ini, e-plus and e-minus. e-ini is an initial value for e in the rate matching algorithm. e-plus is an increment to e in the rate matching algorithm. e-minus is a decrement to e in the rate matching algorithm.

The rate matching engine 88 selects step 108 or step 110, depending on whether a particular channel is convolutionally coded or turbo coded (step 106). This choice is signaled by control information. If the channel is non-turbo coded, the bits are treated as one sequence (step 110). Turbo coding tags each bit with one of three types: systematic (S), parity 1 (P1) and parity 2 (P2). Puncturing is not performed on systematic bits. The rate matching engine treats each of these types of bits as a separate sequences (step 108). Treating these bits as separately eliminates the explicit need for bit separation and bit collection as described in the standard.

A preferred rate matching algorithm for Push address mapping is as follows (step 112).

Parameter Definitions:

$e_{ini}$ initial error between current and desired puncturing ratio $e_{minus}$ Decrement of variable e $e_{plus}$ Increment of variable e X Number of bits before rate matching (transmit perspective)

p Address to map bit to after puncturing or repeating u Address of bit before rate matching (transmit perspective)

e Temporary variable which holds the "error" as identified in the standards i The sequence identifier (i.e. S, P1, or P2)

f Function representing remainder of Push processing engines which further resolve address p and writes bit u to the appropriate physical channel If puncturing is to be performed, the following algorithm is used.

```
e_i = e_ini,i
p = 0
u = 0
while u < X
    e_i = e_i − e_minus, i
    if e_i > 0 then                    -- normal no puncture bit
        perform function f(u, p)
        u = u + 1
        p = p + 1
    else                               -- else puncture
        u = u + 1
        e_i = e_i + e_plus, i
    end if
end while
```

If repeating is to be performed, the following algorithm is used.

```
e_i = e_ini, i
p = 0
u = 0
while u < X
    e_i = e_i − e_minus, i
    if e_i > 0 then                    -- normal no repeat bit
        perform function f(u, p)
        u = u + 1
        p = p + 1
    else                               -- else this is a repeat bit
        perform function f(u, p)
        p = p + 1
        e_i = e_i + e_plus, i
    end if
end while
```

Although "push" rate matching is described in conjunction with a preferred TDD/CDMA communication system, it can be used in a variety of applications, such as in a UE, base station or Node-B used with a TDD/CDMA, FDD/CDMA and TDSCDMA system.

The next step in the process is bit scrambling. In bit scrambling the order of the bits are rearranged to remove a DC bias. The bit scrambling engine determines a bit scrambled address for the address output by the rate matching engine.

In bit scrambling, the bits are scrambled using a scrambling code. The scrambling of the bits is used to remove a DC bias. The bits prior to bit scrambling are represented, such as by $h_1$, $h_2, h_3, \ldots, h_S$. S is the number of bits in a CCTrCH, otherwise referred to as a scrambling block. A $k^{th}$ bit of the S bits is determined per Equations 1 and 2.

$$s_k = h_k \oplus p_k, \quad \text{where } k = 1,2,\ldots,S \qquad \text{Equation 1}$$

$$p_k = \left(\sum_{i=1}^{16} g_i \cdot p_{k-i}\right)\text{mod}2;\ p_k = 0 \text{ for } k < 1; \qquad \text{Equation 2}$$

$$p_i = 1;\ g = \{0,0,0,0,0,0,0,0,0,0,1,0,1,1,0,1\}$$

$p_k$ is a $k^{th}$ bit of the scrambling code. $g_i$ is an $i^{th}$ bit of g.

Figure 6:
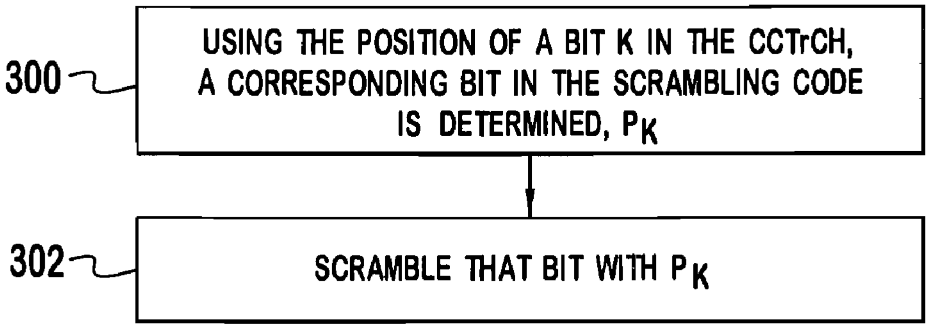
FIG. 6 is a flow chart for "push" bit scrambling.

The process of bit scrambling is explained in conjunction with the flow chart of FIG. 6. Using the position, k, of a bit in the CCTrCH, a corresponding bit in the scrambling code $p_k$ is determined, step 300. The bit, $h_k$, is scrambled, such as by exclusive-oring the bit with $p_k$, step 302.

Figure 7:
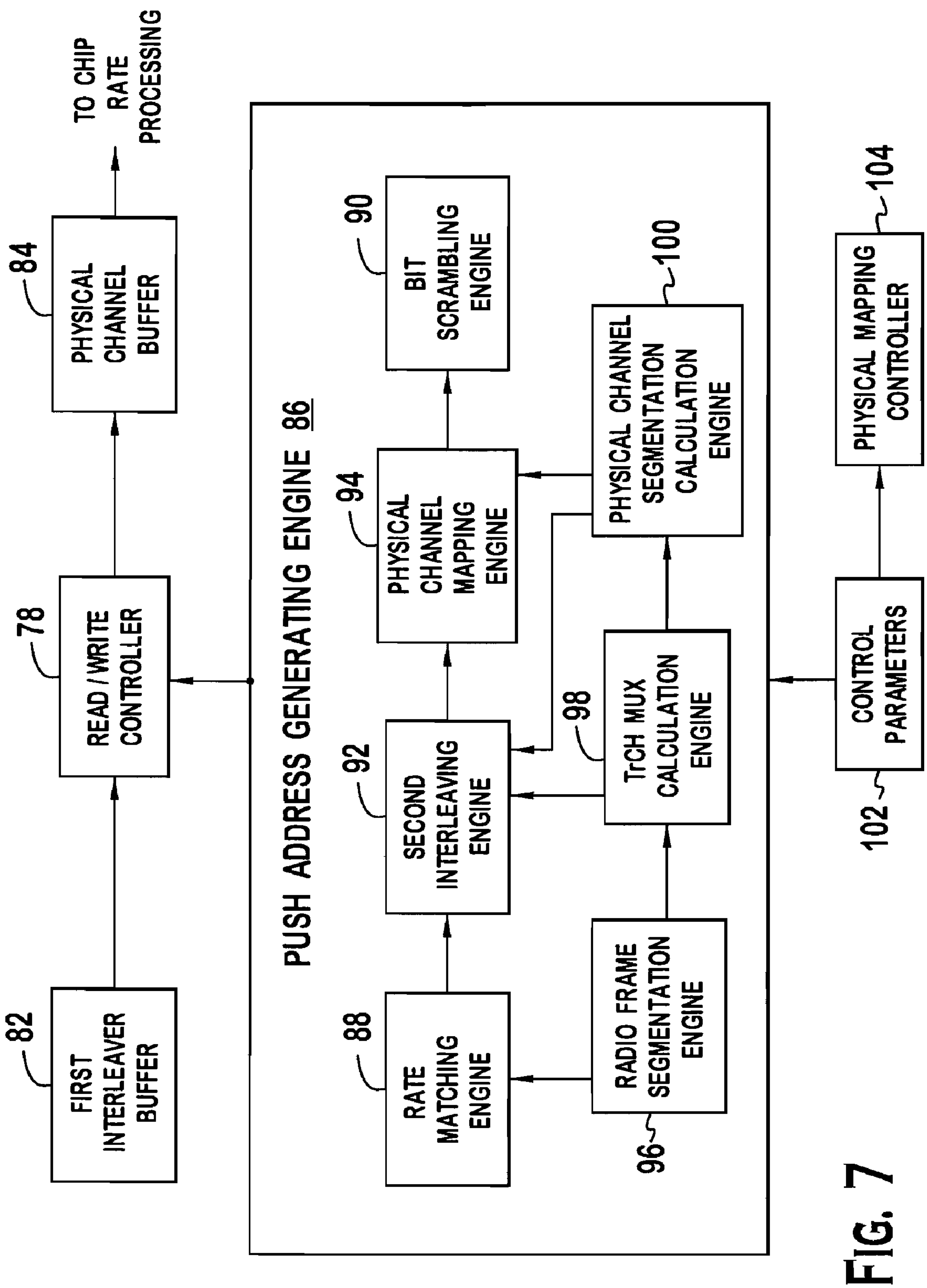
FIG. 7 is a simplified diagram of an alternate embodiment of the "push" approach.
Figure 8:
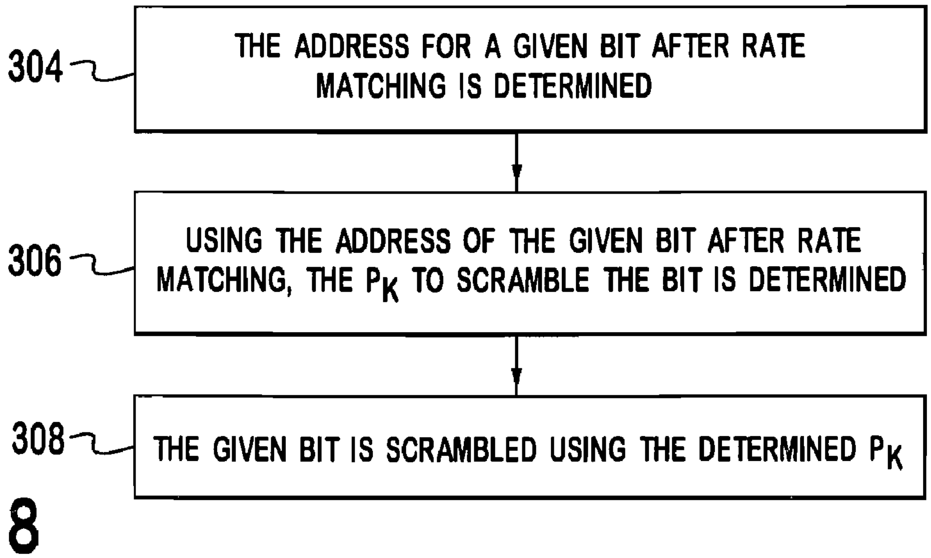
FIG. 8 is a flow chart of the alternate embodiment of "push" bit scrambling.

In an alternate embodiment as shown in FIG. 7 and described with the flow chart of FIG. 8, the bit scrambling engine 90 is located after the other engines 88, 92, 94 (rate matching, second interleaving and physical channel mapping). This embodiment allows for the all of the address mapping to be performed prior to any manipulation of the value of the bits. The bit scrambling engine determines the address of a given bit after rate matching, step 304. Using the address of the given bit after rate matching, the $p_k$ to scramble the bit is determined, step 306. The given bit is scrambled, such as by exclusive-oring, using the determined $p_k$, step 308.

Although "push" bit scrambling is described in conjunction with a preferred TDD/CDMA communication system, it can be used in a variety of applications, such as preferably in a UE, base station or Node-B of a TDD/CDMA system.

A second interleaver engine 92 is used to interleave the bits after rate matching. Initially, the second interleaver engine 92 needs to know whether second interleaving is to be performed over an entire CCTrCH or a single time slot of the CCTrCH. This information is signaled in from higher layers. In second interleaving, the bits are read in row wise, such as over 30 columns. After being read into the array, the columns are permuted. The bits are subsequently read out of the permuted columns.

Figure 9:
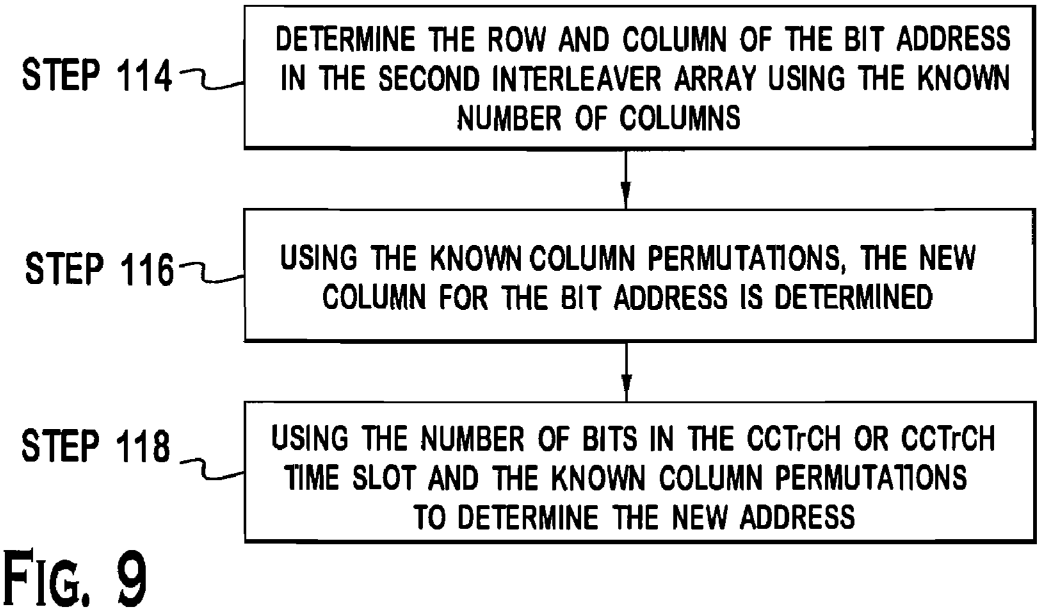
FIG. 9 is a flow chart for "push" second interleaving.

Second interleaving is described in conjunction with FIGS. 9 and 10. The address, u, for a bit prior to second interleaving (after bit scrambling) is used to determine the address, p, after second interleaving. Using the known number of columns for the array, such as 30 columns, the column and row of the bit in the array is determined (step 114). To illustrate using FIG. 10, a bit at address, 58, after bit scrambling is to be analyzed. By dividing the address and rounding down, the row of the bit is determined, (row 1: 58/30=1 remainder 29). The column is determined from the remainder of the division. In this illustration, the column is determined by subtracting one from the remainder, column 28 (29-1). Using the known column permutations, the new column for the bit is determined (step 116). For this illustration, column 28 is permuted to column 11. The number of bits in the CCTrCH or CCTrCH time slot and the column offsets determine the address, p, of the bit after second interleaving (step 118). In this illustration, 7 columns prior to column 11 have 3 bits and four columns have 2 bits. As a result, the bit is at address 30 after second interleaving.

Although "push" second interleaving is described in conjunction with a preferred TDD/CDMA communication system, it can be used in a variety of applications, such as in a UE, base station or Node-B used with a TDD/CDMA, FDD/CDMA and TDSCDMA system.

Figure 11:
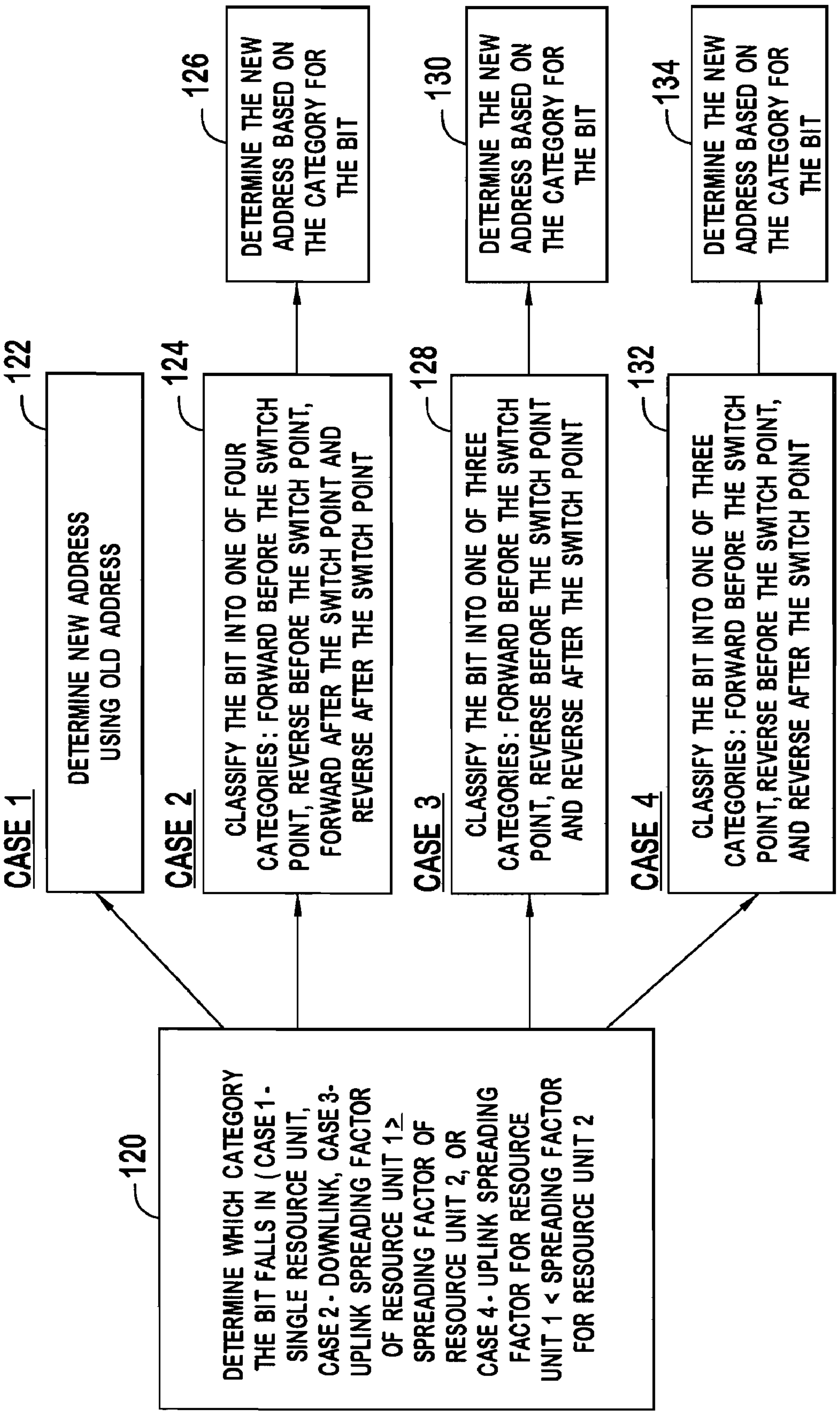
FIG. 11 is a flow chart for "push" physical channel mapping.

After second interleaving, the bits for each CCTrCH are mapped into the physical channels/resource units. Physical channel mapping is described in conjunction with FIG. 11. Physical channel mapping uses a different mapping approach for four different cases. In the first case, a time slot has only one resource unit for the CCTrCH. In the second case, more than one resource unit is used in a time slot for the downlink. In a third case, more than one resource unit is used in the uplink and the spreading factor of data in the first resource unit is greater than or equal to the spreading factor of the second resource unit. In a fourth case, more than one resource unit is used in the uplink and the spreading factor of the first resource unit is less than the spreading factor of the second resource unit. In the uplink, only two resource units can be used for a CCTrCH in a time slot. The physical channel mapping engine 100 categorizes the address, u, of the input bit into one of the four categories (step 120).

For the first case (single resource unit in a time slot), bits are sequentially assigned to the resource unit. Accordingly, the address, u, of the bit after second interleaving directly corresponds to the address, p, in the resource unit (step 122).

For the second case (downlink for multiple resource units), bits are assigned to each resource unit in sequence. A first bit is assigned to resource unit 1, a second bit to resource unit 2 and so on until the last resource unit is reached. When the last resource unit is reached, the next bit is assigned to resource unit 1.

The assigning to each resource unit can be viewed as a modulo counting. Using the illustration of FIG. 12, there are three resource units. Filling the resource units is a modulo 3 counting. In general for N resource units, the resource units are filled using a modulo N counting.

Odd resource units are filled from left to right and even resource units are filled in reverse order, from right to left. As shown in FIG. 12, resource units 1 and 3 are filled from left to right and resource unit 2 is filled from right to left.

The bits are filled in this manner until one of the resource units is filled. This point is referred to as the switch point. At the switch point, the modulus drops by the number of filled resource units. Using FIG. 12 as an illustration, resource unit one is filled at bit 681. After the remaining resource units are filled, resource units 2 and 3 are filled using a modulo 2 counting, starting at bit 684 (the switch point).

The physical channel mapping engine classifies bits into one of four categories: forward before the switch point, reverse before the switch point, forward after the switch point and reverse after the switch point (step 124). Forward indicates that the bits are filled from left to right and reverse indicates that the bits are filled from right to left. The address for a bit is determined based on its category (step 126).

The switch point is derived from the length of the shortest resource unit and multiplying that length by the number of resource units. Using FIG. 12, the first resource unit is 228 bits long. The switch point is 228×3 resource units or 684. After the switch point is determined, whether the bit is forward or reverse is determined. For bits prior to the switch point, the remainder of dividing the bit address by the modulus determines the address. To illustrate using address 682, 682 divided by the modulus, 3, equals 227, remainder 1. Since the resource units are numbered from one to three and not from zero to two, one is added to the remainder to result in the bit being in resource unit 2. For classification, bits in odd resource units are forward and even are reverse.

After the switch point, a similar approach is used. The switch point is subtracted from the bit address and the remainder of that result divided by the new modulus is used to determine the bits resource unit.

After the bit has been categorized, one of four formulas are used to determine its address. For forward before the switch point, Equation 3 is used.

$$p=\text{Start}+u/\text{mod} \quad \text{Equation 3}$$

Start is the first address in that resource unit, such as bit 0. u is the address of the bit after physical channel mapping. p is the determined resource unit address. mod is the modulus number, such as 3 in the example, prior to the switch point.

For reverse before the switch point, Equation 4 is used.

$$p=\text{End}-u/\text{mod} \quad \text{Equation 4}$$

End is last address in that resource unit.

For forward after the switch point, Equation 5 is used.

$$p=\text{Start}+\text{SP}/\text{mod}+(u-\text{SP})/\text{mod}_{sp} \quad \text{Equation 5}$$

SP is the switch point and $\text{mod}_{sp}$ is the modulus after the switch point.

For reverse after the switch point, Equation 6 is used.

$$p=\text{End}-\text{SP}/\text{mod}-(u-\text{SP})/\text{mod}_{sp}-1 \quad \text{Equation 6}$$

For case 3 (uplink where the first resource unit has a higher spreading factor than the second resource unit), the bits are filled into the resource units using a modulus based on the two resource units spreading factors. Equation 7 is used to determine the modulus.

$$\text{mod}=1+\max((\text{SF1},\text{SF2})/\min(\text{SF1},\text{SF2})) \quad \text{Equation 7}$$

SF1 is the spreading factor for resource unit 1 and SF2 is the spreading factor for resource unit 2.

To illustrate using FIG. 13, resource unit 1 has a spreading factor of 16 and resource unit 1 has a spreading factor of 4. As a result, the resource units are filled using a modulo 5 counting. Accordingly, resource unit 1 has bits 0 and 5 and resource unit 2 has bit 1 to 4. After resource unit 1 is filled, the remaining bits are sequentially filled in resource unit 2. The point where resource unit 1 is filled is the switch point. Resource unit 1 is always filled left to right and resource unit 2 is filled in reverse.

The physical channel mapping engine classifies bits into one of three categories: forward before the switch point, reverse before the switch point, and reverse after the switch point (step 128). The address for a bit is determined based on its category (step 130).

The switch point is derived from the length of the first resource unit per Equation 8.

SP=mod*length of first resource unit  Equation 8

After the switch point is determined, whether the bit is forward or reverse is determined. For bits prior to the switch point, if there is a remainder of dividing the bit address by the modulus, that bit is in the second resource unit. To illustrate for bit 4, 4 divided by the modulus, 5, results in a remainder of 4. As shown in FIG. 10, bit 4 is in resource unit 2 as expected. If there is no remainder, the bit is in the first resource unit.

After the switch point, all bits are in the second resource unit.

After the bit has been categorized, one of three formulas are used to determine its address. For forward before the switch point, Equation 9 is used.

$p$=Start+$u$/mod  Equation 9

For reverse before the switch point, Equation 10 is used.

$p$=End−((mod−1)*($u$/mod)−BN%mod  Equation 10

BN%mod is the bit number modulo by the value for mod. To illustrate for a mod=5, BN%mod is $mod_5$ (bit number).

For reverse after the switch point, Equation 11 is used.

$p$=End−mod*SP/(mod+1)−($u$−SP)  Equation 11

For case 4 (uplink where first resource unit has a lower spreading factor than the second resource unit), the bits are also filled into the resource units using a modulus based on the two resource units spreading factors. Equation 7 is also used to determine the modulus.

To illustrate using FIG. 14, resource unit 2 has a spreading factor of 16 and resource unit 1 has a spreading factor of 4. As a result, the resource units are filled using a modulo 5 counting. Accordingly, resource unit 1 has bits 0 to 3 and resource unit 2 has bit 4. After resource unit 1 is filled, the remaining bits are sequentially filled in resource unit 2. The point where resource unit 1 is filled is the switch point. Resource unit 1 is always filled left to right and resource unit 2 is filled in reverse.

The physical channel mapping engine classifies bits into one of three categories: forward before the switch point, reverse before the switch point, and reverse after the switch point (step 132). The address for a bit is determined based on its category (step 134).

The switch point is derived from the length of the first resource unit per Equation 12.

SP=mod*length of first resource unit/(mod−1)  Equation 12

After the switch point is determined, whether the bit is forward or reverse is determined. For bits prior to the switch point, if there is a remainder of dividing the bit address plus one by the modulus, that bit is in the first resource unit. Otherwise, it is in the second resource unit. After the switch point, all bits are in the second resource unit.

After the bit has been categorized, one of three formulas are used to determine its address. For forward before the switch point, Equation 13 is used.

$p$=Start+((mod−1)*($u$/mod))+BN%mod  Equation 13

For reverse before the switch point, Equation 14 is used.

$p$=End−$u$/mod  Equation 14

For reverse after the switch point, Equation 15 is used.

$p$=End−SP/(mod+1)−($u$−SP)  Equation 15

Using these equations for the four cases, the physical channel mapping engine 94 determines the resource unit address, p, for a particular address, u, prior to physical channel mapping.

Although "push" channel mapping is described in conjunction with a preferred TDD/CDMA communication system, it can be used in a variety of applications, such as preferably in a UE, base station or Node-B of a TDD/CDMA system.

Figure 15:
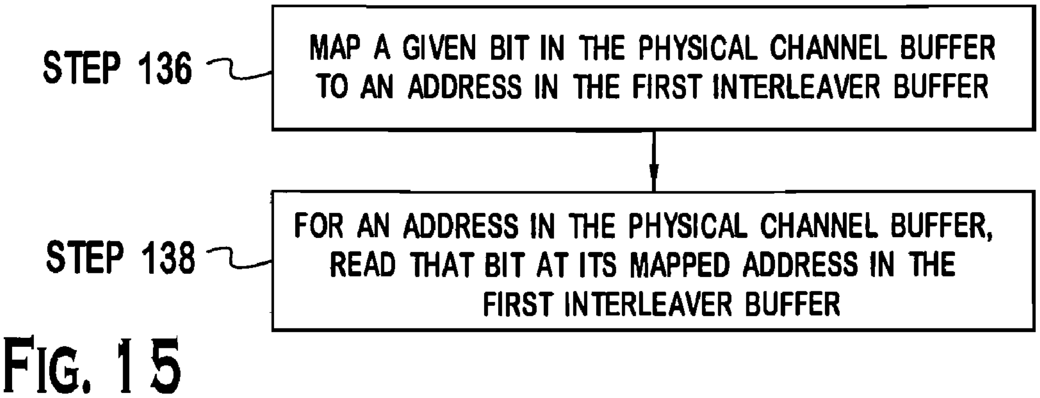
FIG. 15 is a flow chart for the "pull" approach.

Another approach to physical channel processing is referred to as the "pull" approach, as shown in FIG. 15. In the "pull" approach on the transmit side, each bit to be input to the physical channel buffer 146 is mapped to a bit or bits of the first interleaver buffer 144 (step 136). To illustrate, an address in the physical channel buffer 146 is mapped an address in the first interleaver buffer 144. After the bit is mapped, it is inserted into the physical channel buffer 146 by reading the corresponding location in the first interleaver buffer 144 (step 138). Data in the physical channel buffer 146 is sent to chip rate processing for transmission over the air interface. On the receive side, bits are read from the physical channel buffer 146 and written to the first interleaver buffer 144. As a result, the "pull" approach on the receive side is the reverse of the transmit side. In the following, the "pull" approach is primarily described from the transmit side. The receive side is performed in an analogous reverse order.

Figure 16:
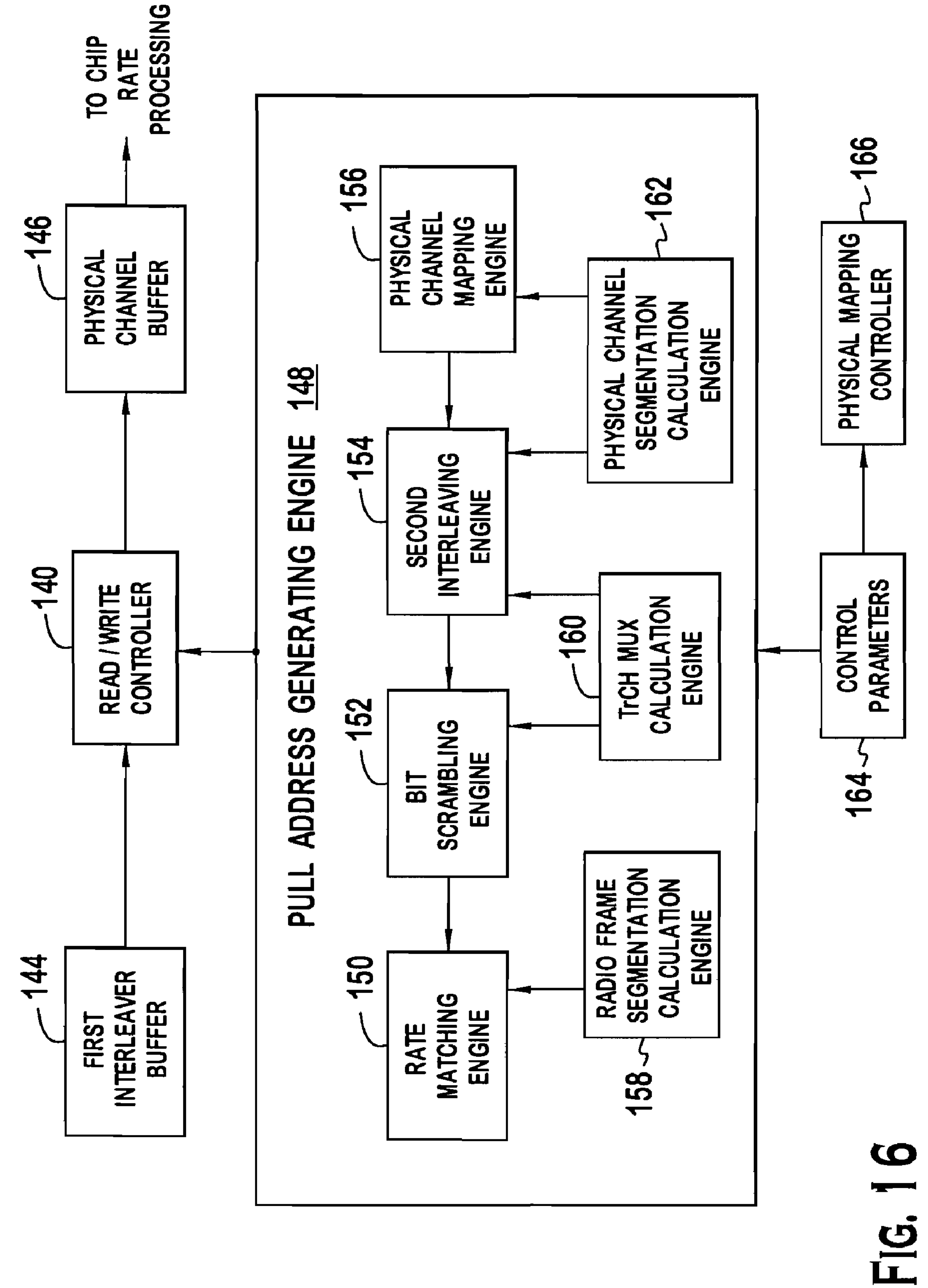
FIG. 16 is a simplified diagram of an embodiment of the "pull" approach.

FIG. 16 is a block diagram of an embodiment of the "pull" approach. A pull address generating engine 148 determines bits to be written to the physical channel buffer 146. An advantage of the "pull" approach is that resource units can be filled as needed eliminating the need to buffer physical channel data over multiple timeslots. To illustrate, if only one resource unit is transmitted in the first time slot of a frame, the "pull" approach can selectively only "pull" bits for that resource unit. As a result, the pull approach can be used to reduce physical channel buffering to only a single time slot.

The bits in the "pull" approach may be taken one at a time or in groups, such as 8 bits, 16 bits or 32 bits. The bits are preferably taken in sequence from the first bit to the last bit of a resource unit, although the bits may be taken in other sequences. The pull address generating engine 148 determines the address to read the bit from in the first interleaver buffer 144. The pull address generating engine 148 uses control parameters, which are either standardized or signaled, to determine the proper address.

The pull address generating engine 148 sends a control signal to a read/write controller 140. The read/write controller 140 reads a bit from the determined address in the first interleaver buffer 144 and writes that bit to the address of the physical channel buffer 146. These operations are controlled by the physical mapping controller 166, which also uses the control parameters to oversee the physical layer processing operation.

Similar to the "push" approach, the pull address generating engine 148 has four primary sub-engines: a rate matching engine 150, a bit scrambling engine 152, a second interleaving engine 154 and a physical channel mapping engine 156.

Also, three other sub-engines feed information to the four primary engines: a radio frame segmentation calculation engine 158, a TrCH multiplexing (MUX) calculation engine 158 and a physical channel segmentation calculation engine 162.

In contrast to the "push" approach, the four primary engines 150, 152, 154, 156 operate in the order indicated in FIG. 16 on the transmit side. Reverse physical channel mapping is performed first. Subsequently, reverse second interleaving is performed, followed by reverse bit scrambling. Finally, reverse rate matching is performed.

The physical channel mapping engine 156 performs a reverse physical channel mapping. For each bit address in a resource unit, a corresponding address prior to physical channel mapping is determined.

Figure 17:
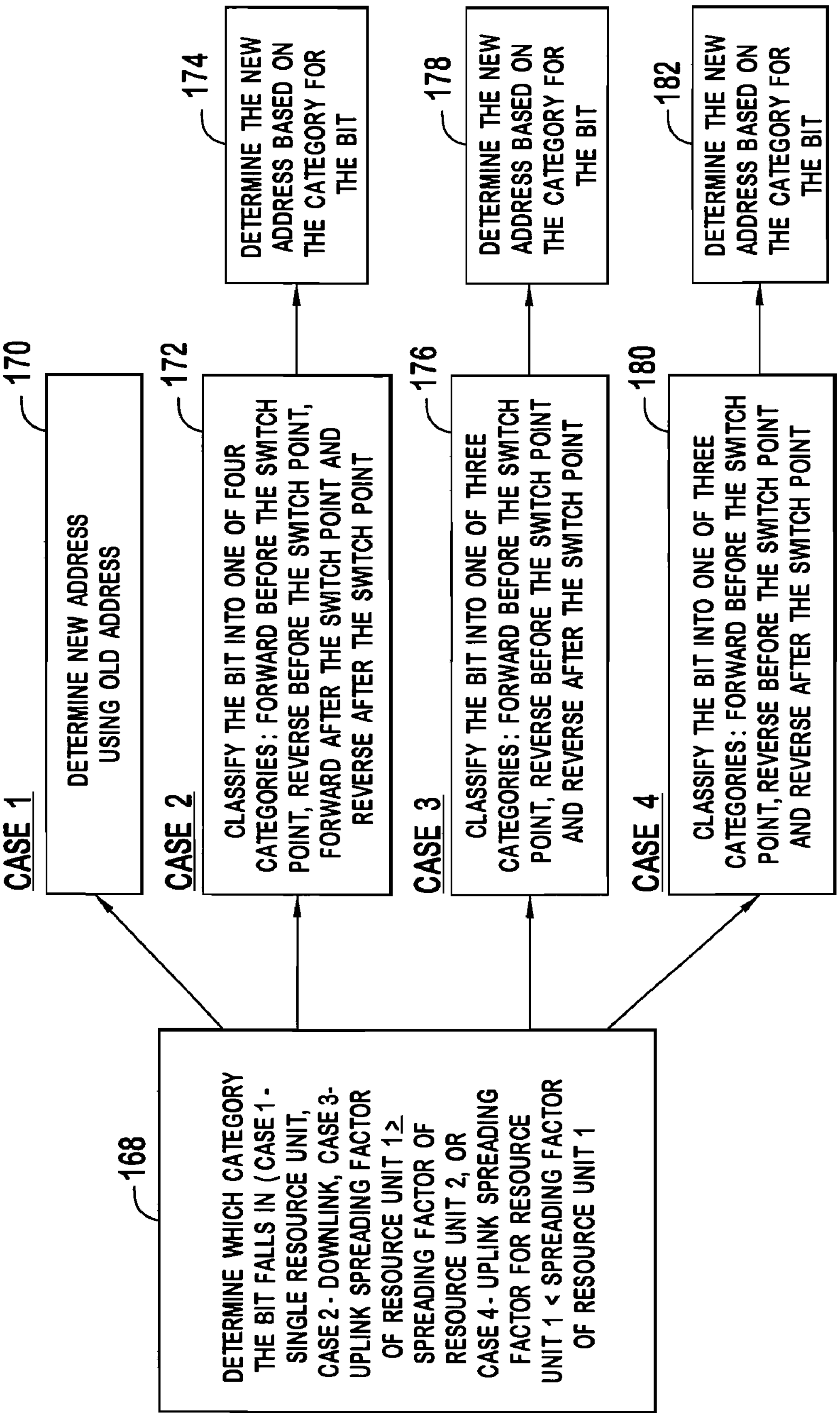
FIG. 17 is a flow chart for the "pull" reverse physical channel mapping.

Physical channel mapping using a different mapping approach for four different cases. Physical channel mapping is described in conjunction with FIG. 17. In the first case, a time slot has only one resource unit for the CCTrCH. In the second case, more than one resource unit is used in a time slot for the downlink. In a third case, more than one resource unit is used in the uplink and the spreading factor of data in the first resource unit is greater than or equal to the spreading factor of the second resource unit. In a fourth case, more than one resource unit is used in the uplink and the spreading factor of the first resource unit is less than the spreading factor of the second resource unit.

The physical mapping engine 156 determines which case applies to each resource unit bit address (step 168). For the first case (single resource unit in a time slot), bits are sequentially assigned to the resource unit. Accordingly, the address, p, of the bit in the resource unit directly corresponds to the address, u, prior to physical channel mapping (step 170). For the second case (downlink for multiple resource units). The physical channel mapping engine 156 classifies bits into one of four categories: forward before the switch point, reverse before the switch point, forward after the switch point and reverse after the switch point (step 172). Forward indicates that the bits are filled from left to right and reverse indicates that the bits are filled from right to left. The address for a bit is determined based on its category (step 174).

The switch point for odd resource units is the length of the shortest resource unit. Using the example of FIG. 18, the switching point is 228 (the length of the shortest resource unit). For even resource units, the switch point is the last address in the resource unit less the length of the shortest resource unit number. After the switch point is determined, whether the bit is forward or reverse is determined, based on its resource unit. Odd resource units are forward and even are reverse.

After the bit has been categorized, one of four formulas are used to determine its address. For forward before the switch point, Equation 16 is used.

$$u=p*\text{mod}+\text{ru}\%\text{mod} \qquad \text{Equation 16}$$

u is the address of the bit as reverse physical channel mapped. p is the resource unit address. mod is the modulus counting prior to the switch point. ru%mod is the resource unit bit number modulo of the value of mod.

For reverse before the switch point, Equation 17 is used.

$$u=\text{End}-p*\text{mod}+1 \qquad \text{Equation 17}$$

End is the last address in that resource unit.

For forward after the switch point, Equation 18 is used.

$$u=\text{SP}*\text{mod}+(p-\text{SP})*(\text{mod}_{sp}) \qquad \text{Equation 18}$$

SP is the switch point and $\text{mod}_{sp}$ is the modulus after the switch point.

For reverse after the switch point, Equation 19 is used.

$$u=\text{SP}*\text{mod}-(\text{End}-\text{SP}-p)*(\text{mod}_{sp}-1)+\text{RU}-2 \qquad \text{Equation 19}$$

RU is the resource unit number of the bit.

For case 3 (uplink where first resource unit has a higher spreading factor than the second resource unit), the bits are filled into the resource units using a modulus based on the two resource units spreading factors as previously described.

The physical channel mapping engine 156 classifies bits into one of three categories: forward before the switch point, reverse before the switch point, and reverse after the switch point (step 176). The address for a bit is determined based on its category (step 178).

Two switch points are used for case 3 physical channel mapping: a forward switch point (SPF) and a reverse switch point (SPR). The forward switch point is the switch point of the first resource unit, which is equal to its length, such as 228 in FIG. 19. The reverse switch point is the switch point of the second resource unit, which is determined per Equation 20.

$$\text{SPR}=\text{End}-(\text{mod}-1)*\text{SPF} \qquad \text{Equation 20}$$

End is the last address in resource unit 2.

After the bit has been categorized, one of three formulas are used to determine its address. For forward before the switch point, Equation 21 is used.

$$u=\text{mod}*p \qquad \text{Equation 21}$$

For reverse before the switch point, Equation 22 is used.

$$u=\text{mod}*INT((\text{LP2}-\text{ru}POS)/(\text{mod}-1)+\text{MOD}(\text{LP2}-\text{ru}POS,(\text{mod}-1))+1 \qquad \text{Equation 22}$$

INT is the integer operator. MOD is the modulo operator. LP2 is the last point in resource unit 2. ruPOS is the bit position number of the bit in the resource unit.

For reverse after the switch point, Equation 23 is used.

$$u=\text{mod}+\text{SPF}+\text{SPR}-p-1 \qquad \text{Equation 23}$$

For case 4 (uplink where first resource unit has a lower spreading factor than the second resource unit), the bits are also filled into the resource units using a modulus based on the two resource units spreading factors, as previously described.

The physical channel mapping engine 156 classifies bits into one of three categories: forward before the switch point, reverse before the switch point, and reverse after the switch point (step 180). The address for a bit is determined based on its category (step 182).

Only a reverse switch point (SPR) is used for case 4 physical channel mapping. The reverse switch point is the switch point of the second resource unit, which is determined per Equation 24.

$$\text{SPR}=\text{End}-\text{length of the resource unit }1/(\text{mod}-1) \qquad \text{Equation 24}$$

End is the last address in resource unit 2.

After the bit has been categorized, one of three formulas are used to determine its address. For forward before the switch point, Equation 25 is used.

$$u=\text{mod}*INT(p/(\text{mod}-1))+\text{ru}POS\%(\text{mod}-1) \qquad \text{Equation 25}$$

ruPOS%(mod−1) is the bit position in the resource unit modulo by the value of (mod−1).

For reverse before the switch point, Equation 26 is used.

$$u=\text{mod}*(\text{LP2}-p)+(\text{mod}-1) \qquad \text{Equation 26}$$

For reverse after the switch point, Equation 27 is used.

$$u=\text{mod}*(\text{LP2}-\text{SPR}+1)+(\text{LP2}-p)\%\text{modMinus1} \qquad \text{Equation 27}$$

Using these equations for the four cases, the physical channel mapping engine 156 determines the resource unit address, p, for a particular second interleaver bit address, u.

Although "pull" physical channel mapping is described in conjunction with a preferred TDD/CDMA communication system, it can be used in a variety of applications, such as in a UE, base station or Node-B of a TDD/CDMA system.

A second interleaving engine 154 is used to reverse interleave the bits after physical channel mapping. Initially, the second interleaving engine 154 needs to know whether second interleaving is to be performed over an entire CCTrCH or is performed for a single timeslot of the CCTrCH. This information is signaled in from higher layers.

Figure 21:
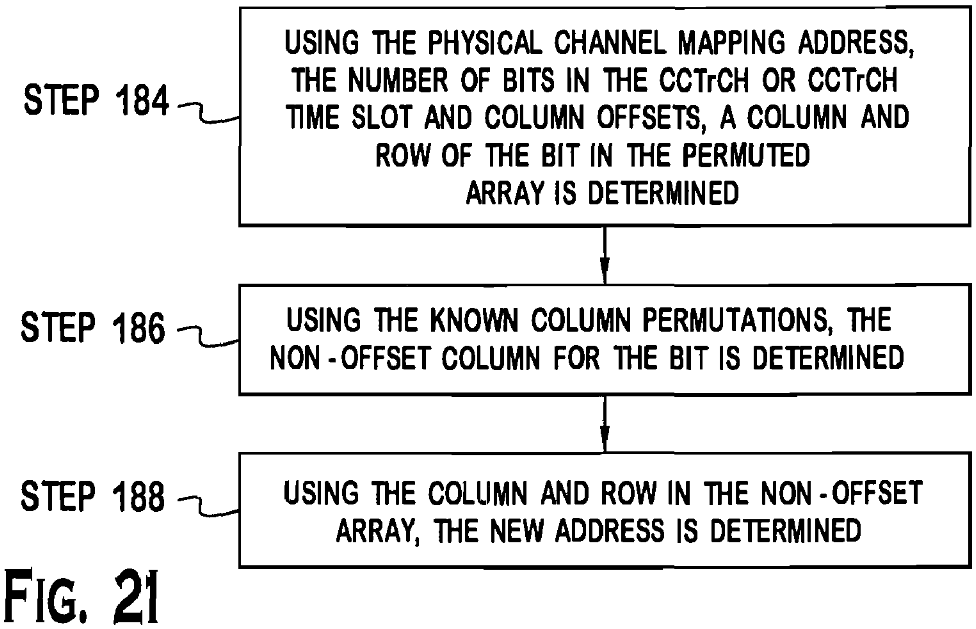
FIG. 21 is a flow chart for "pull" reverse second interleaving.

Second interleaving is described in conjunction with FIG. 21. The particular address, p, of the bit after physical channel mapping is used to determine the address, u, after reverse second interleaving. Using the total number of bits in the CCTrCH or CCTrCH time slot and the column offsets, a number of bits in each column is determined. Using the address p, the column and row of the bit in the permuted array are determined (step 184). To illustrate using the example of FIG. 22, a bit at address p=61 in the physical channel buffer is analyzed. Using the total number of bits and the column offsets, it is known that column 0 has five bits and the other columns have four bits. Using the known number of bits for each column, the column and row for the bit is determined (column 12, row 1).

Using the known column permutations, the non-offset column is determined (step 186). For the above illustration, offset column 12 corresponds to non-offset column 1. Using the column and row of the bit in the non-offset array, the address for the bit is determined (step 188). For the prior illustration, the address of the bit is address 6.

Although "pull" second interleaving is described in conjunction with a preferred TDD/CDMA communication system, it can be used in a variety of applications, such as in a UE, base station or Node-B used with a TDD/CDMA, FDD/CDMA and TDSCDMA system.

As previously described, in rate matching, bits are punctured and repeated to both minimize the number of required channels and to assure each channel is fully utilized. The rate matching engine 150 determines addresses that each bit of the first interleaver buffer will be in after reverse rate matching. Rate matching primarily uses three variables: e-ini, e-plus and e-minus. e-ini is an initial value for e in the rate matching algorithm. e-plus is an increment to e in the rate matching algorithm. e-minus is a decrement to e in the rate matching algorithm.

Figure 23:
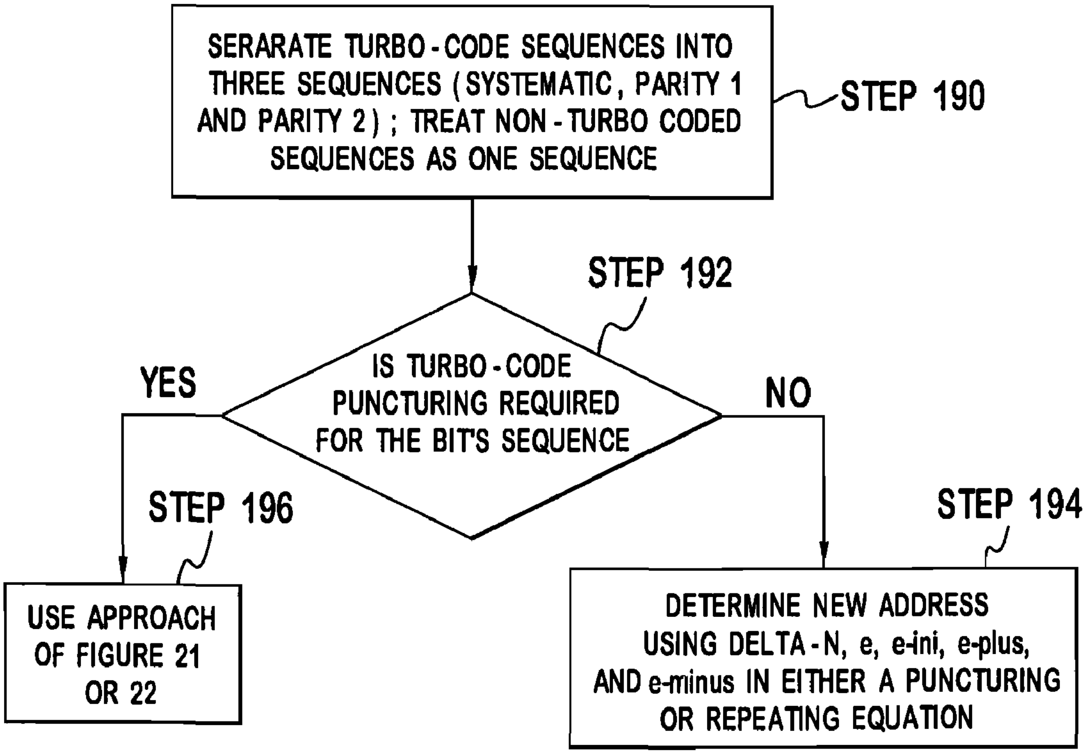
FIG. 23 is a flow chart for "pull" reverse rate matching.
Figure 24:
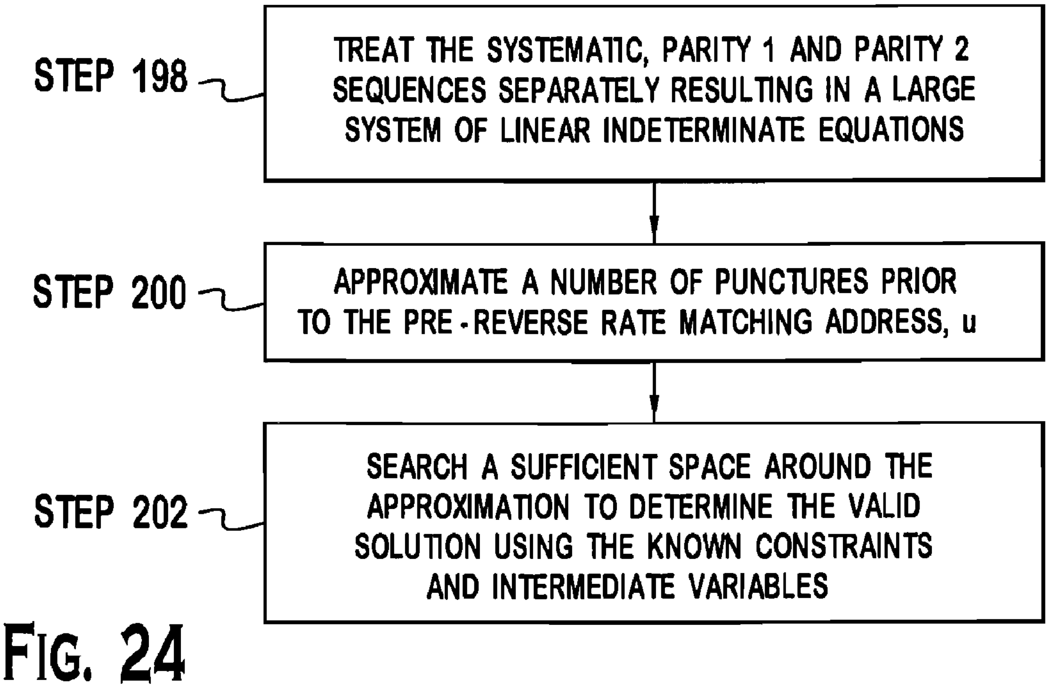
FIGS. 24 and 25 are flow charts for two approaches to "pull" reverse rate matching for punctured turbo code sequences.
Figure 25:
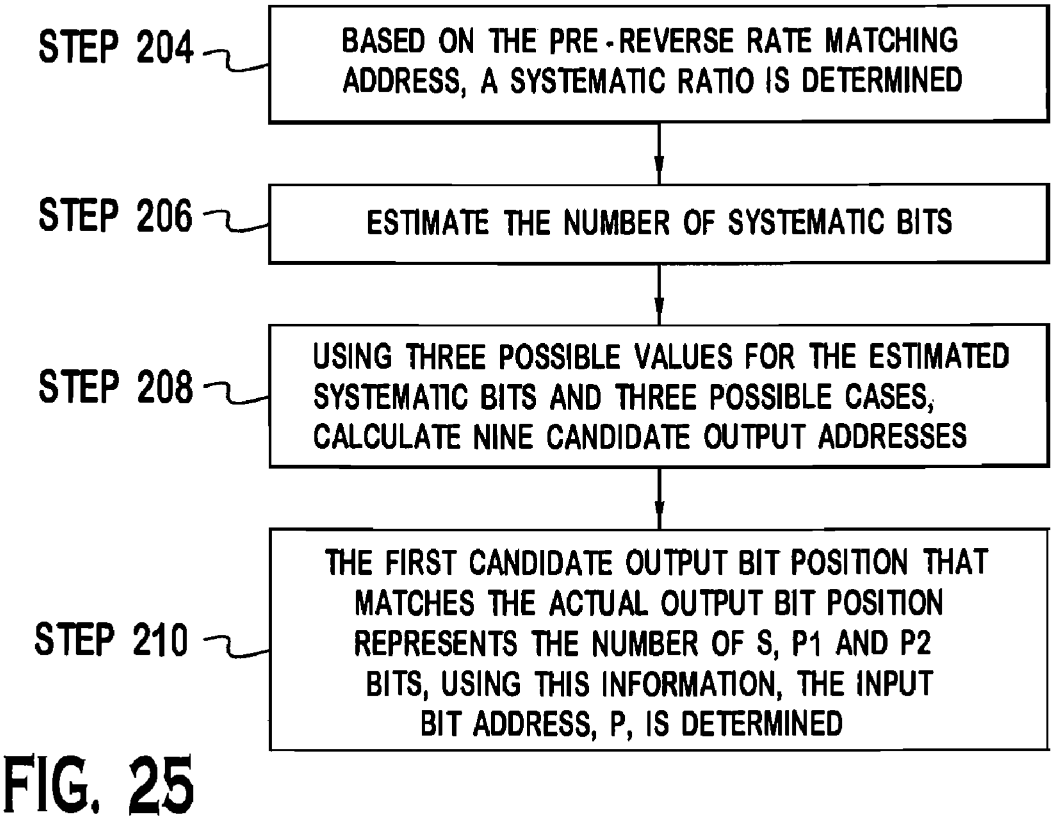

Rate matching is described in conjunction with the flow charts of FIGS. 23-25. The rate matching engine 150 determines whether data for a particular channel is non-turbo coded, such as convolutional coded, or turbo coded. If the channel is non-turbo coded, the bits are treated as one sequence.

Turbo coding uses three types of bits: systematic (S), parity 1 (P1) and parity 2 (P2). Puncturing is not performed on systematic bits. The rate matching engine 150 treats each of these types of bits as a separate string (step 190). By treating these bits as separate strings eliminates the explicit need for bit separation and bit collection as described in the standard. This functionality is dealt with by separately handling each sequence.

The address calculation for the sequences, excluding when turbo coding puncturing (step 192) is required, is functionally performed by Equation 28 for puncturing and Equation 29 for repeating (step 194).

$$u = \left\lfloor \frac{pe^+ - e^{ini} + e^-}{e^+ - e^-} \right\rfloor + 1 \qquad \text{Equation 28}$$

$$u = \left\lfloor \frac{e^{ini} + pe^+}{e^- - e^+} \right\rfloor \qquad \text{Equation 29}$$

u is the calculated address for the bit in the first interleaver buffer. p is the address of the bit prior to reverse rate matching.

Puncturing of turbo coded sequences is treated differently. Two general approaches can be used to determine the address for these bits, as shown in FIGS. 24 and 25. In a first approach as shown in FIG. 24, the sequences of S, P1 and P2 are treated independently. As a result, a large system of linear indeterminate equations results. These equations can be solved using the particular constraints on the unknown variable (step 198), mainly that the addresses u and p are constrained to integer values. Using the constraints, the solution space is narrowed such that only one u solution exists for any given p. To implement this approach, the number of punctures prior to the u address is approximated (step 200). A search is conducted having a sufficient space around the approximation to determine the valid solution. The valid solution is determined using the known constraints on the intermediate variables (step 202).

The following is a preferred technique for applying the first approach. Systematic bits (S) are never punctured. Equation 30 describes the state of the "e" variable at any given address, u, in the puncturing operation for P1 bits.

$$e_1=e_1^{ini}u_1e_1^-+n_1e_1^+ \qquad \text{Equation 30}$$

$e_1$ is the variable e for P1. Similarly, $e_1^{ini}$, $e_1^-$ and $e_1^+$ are the $e_1^{ini}$, $e^-$ and $e^+$ for, respectively, for P1. $u_1$ is the number of bits of the P1 sequence prior to the address u being determined. $n_1$ is the number of punctured bits prior to the current value of $u_1$ in the P1 sequence.

Equation 31 describes the state of the "e" variable at any given address, u, in the puncturing operation for P2 bits.

$$e_2=e_2^{ini}-u_2e_2^-+n_2e_2^+ \qquad \text{Equation 31}$$

$e_2$ is the variable e for P2. Similarly, $e_2^{ini}$, $e_2^-$ and $e_2^+$ are the $e^{ini}$, $e^-$ and $e^+$ for, respectively, for P2. $u_2$ is the number of bits of the P2 sequence prior to the address u being determined. $n_2$ is the number of punctured bits prior to the current value of $u_2$ in the P2 sequence.

For a given p, Equation 32 is used.

$$u-p=n_1+n_2 \qquad \text{Equation 32}$$

Equations 33 and 34 are known to be true from inspection of the rate matching algorithm in the standards.

$$0<e_1\leqq e_1^+ \qquad \text{Equation 33}$$

$$0<e_2\leqq e_2^+ \qquad \text{Equation 34}$$

The above linear inequalities consist of three equations and five unknowns ($u$, $e_1$, $e_2$, $n_1$, $n_2$). To determine the solutions of these equations, values for n1 and n2 are approximated. A sufficient space around this approximation is searched. The solution is determined based on the constraints of Equations 33 and 34.

The approximation of n1 and n2 is determined by replacing u in Equation 32 per Equation 35.

$$u = \frac{p}{\gamma} \quad \text{Equation 35}$$

Equation 36 results.

$$n_1 + n_2 = \left(\frac{p}{\gamma} - p\right) \quad \text{Equation 36}$$

$\gamma$ is the puncturing ratio, which is determined per Equation 37.

$$\gamma = 1 - \frac{e_1^-}{3e_1^+} - \frac{e_2^-}{3e_2^+} \quad \text{Equation 37}$$

The rate matching parameter determination algorithm per the standard distributes puncturing of P1 and P2 bits evenly, except when odd number of punctures is requested. When an odd number of punctures is requested, P1 gets one more puncture. The rate matching algorithm also allows for no more than two P1 punctures in a row without a P2 puncture. Additionally, no more than two P2 punctures can occur with a P1 puncture. Accordingly, Equations 38 and 39 result.

$$n_1 - n_2 \leqq 3 \quad \text{Equation 38}$$

$$n_2 - n_1 \leqq 2 \quad \text{Equation 39}$$

Using Equations 38, 39 and 36, Equations 40 and 41 result.

$$\frac{p\left(\frac{1}{\gamma} - 1\right) - 2}{2} \leq n_1 \leq \frac{p\left(\frac{1}{\gamma} - 1\right) + 3}{2} \quad \text{Equation 40}$$

$$\frac{p\left(\frac{1}{\gamma} - 1\right) - 3}{2} \leq n_2 \leq \frac{p\left(\frac{1}{\gamma} - 1\right) + 2}{2} \quad \text{Equation 41}$$

These equations are used to determine a small subspace which contains the solution.

For any p in which the corresponding write address u is to be determined, the bit at that address is not punctured (or it would not end up in the physical channel mapping buffer). Accordingly, the value of e must be greater than e& and Equation 42 results.

$$e_x^- < e_x \leqq e_x^+ \quad \text{Equation 42}$$

The subscript x is used generally, since the inequality is true for both x=1 or 2 (for P1 or P2). Using Equations 30 and 31, Equation 43 results.

$$0 < e_x^{ini} - (u_x+1)e_x^- + n_x e_x^+ \leqq e_x^+ - e_x^- \quad \text{Equation 43}$$

Equation 43 is only true when u is a $P_x$ bit. If u is not a $P_x$ bit, Equation 44 applies.

$$0 < e_x^{ini} - (u_x+1)e_x^- + n_x e_x^+ \leqq e_x^+ \quad \text{Equation 44}$$

To identify a valid solution, Equations 45 and 46 are used.

$$\tilde{e}_1 = e_s^{ini} - (u_2+1)e_2^- + n_2 e_2^+ \quad \text{Equation 45}$$

$$\tilde{e}_2 = e_s^{ini} - (u_2+1)e_2^- + n_2 e_2^+ \quad \text{Equation 46}$$

Subsequently, a range check is performed. If u is a P1 bit, Equation 47 is used.

$$(0 < \tilde{e}_1 \leqq e_1^+ - e_1^-) \text{ and } (0 < \tilde{e}_2 \leqq e_2^+) \quad \text{Equation 47}$$

If u is a P2 bit, Equation 48 is used.

$$(0 < \tilde{e}_1 \leqq e_1^+) \text{ and } (0 < \tilde{e}_2 \leqq e_2^+ - e_2^-) \quad \text{Equation 48}$$

If u is an S bit, Equation 49 is used.

$$(0 < \tilde{e}_1 \leqq e_1^+) \text{ and } (0 < \tilde{e}_2 \leqq e_2^+) \quad \text{Equation 49}$$

The second approach, as shown in FIG. 25, is as follows. Based on the u position, the rate matching input bit position, p, is determined. A systematic ratio is determined (step 204). The systematic ratio is based on the puncture ratio for the P1 and P2 sequences. The number of systematic bits $S_{bits}$ is estimated, such as per Equation 50 (step 206).

$$\tilde{S}_{bits} = u/(1 + P1_{PR} + P2_{PR}) \quad \text{Equation 50}$$

$\tilde{S}_{bit}$, is the estimated number of systematic bits. $P1_{PR}$ is the puncturing ratio of the P1 sequence and $P2_{PR}$ is the puncturing ratio for the P2 sequence.

Four cases are assumed depending on the order of the bits (S, P1, P2 is forward and S, P2, P1 is reverse). S is the initial estimate for $\tilde{S}_{bit}$. The cases values are shown in Table 1.

TABLE 1

| Column | Forward | | | Reverse | | |
|---|---|---|---|---|---|---|
| Top | S | P1 | P2 | S | P1 | P2 |
| S | S | S − 1 | S − 1 | S | S − 1 | S − 1 |
| | S | S | S − 1 | S | S − 1 | S |
| | S | S | S | S | S | S |
| | S + 1 | S | S | S + 1 | S | S |
| P1 | S | S | S | S | S | S |
| | S | S + 1 | S | S | S + 1 | S |
| | S | S + 1 | S + 1 | S + 1 | S + 1 | S |
| | S + 1 | S + 1 | S + 1 | S + 1 | S + 1 | S + 1 |
| P2 | S | S | S | S | S | S |
| | S | S | S + 1 | S | S | S + 1 |
| | S + 1 | S | S + 1 | S | S + 1 | S + 1 |
| | S + 1 | S + 1 | S + 1 | S + 1 | S + 1 | S + 1 |

Based on the type of bit being analyzed (column top), the appropriate four rows of Table 1 are selected. To illustrate for a P2 bit, the last four rows (for column top P2) are selected. If the bit is forward, the left most columns are used. If the bit is reverse, the right most columns are used. Using the appropriate four rows and the appropriate three columns of the row, an output index for each row is determined. To illustrate for a forward P2 bit, four cases are used (case 1—S,S,S; case 2—S,S,S+1; case 3—S+1,S,S+1; and case 4—S+1,S+1,S+1).

The four cases are used to calculate four candidates for the output position (step 208). The number of punctured bits is determined for each candidate shown in Table 2. Table 2 also shows the calculation for candidate output bit position.

TABLE 2

| | |
|---|---|
| $P1_{bits}$ | $(e_1^{ini} - P1_{bits} * e_1^-)/e_1^+$ |
| $P2_{bits}$ | $(e_2^{ini} - P2_{bits} * e_2^-/e_2^+$ |
| Candidate Output Bit Position | $S_{bits} - 1 + P1_{bits} + P1_{Pbits} - P1_{Pbits\ sin\ i} + P2_{Pbits} - P2_{Pbit\ sin\ i}$ |

$P1_{Pbits}$ is the number of punctured P1 bits. P2 Pbits is the number of punctured P2 bits. $P1_{Pbit\ sin\ i}$ is the number of initial P1 bits. $P2_{Pbit\ sin\ i}$ is the number of initial P2 bits.

The first candidate output bit position that matches the actual output bit position represents the number of S, P1 and P2 bits. Using this information, the input bit position, p, is determined, (step 210).

Although "pull" rate matching is described in conjunction with a preferred TDD/CDMA communication system, it can be used in a variety of applications, such as in a UE, base station or Node-B used with a TDD/CDMA, FDD/CDMA and TDSCDMA system.

The next step in the process is reverse bit scrambling. The bit scrambling engine determines a bit scrambled address for the address output by the second interleaver.

Figure 26:
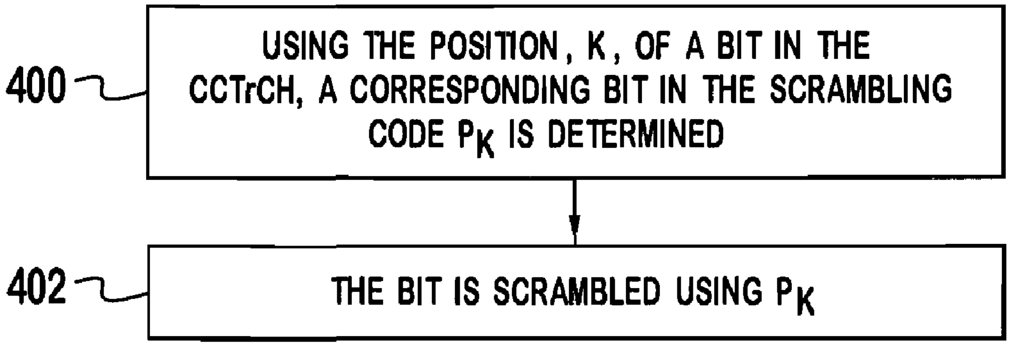
FIG. 26 is a flow chart of an embodiment of "pull" reverse bit scrambling.

The process of reverse bit scrambling is explained in conjunction with the flow chart of FIG. 26. Using the position, k, of a bit in the CCTrCH, a corresponding bit in the scrambling code $p_k$ is determined (step 400). The bit, $h_k$, is scrambled, such as by exclusive-oring the bit with $p_k$ (step 402).

Figure 28:
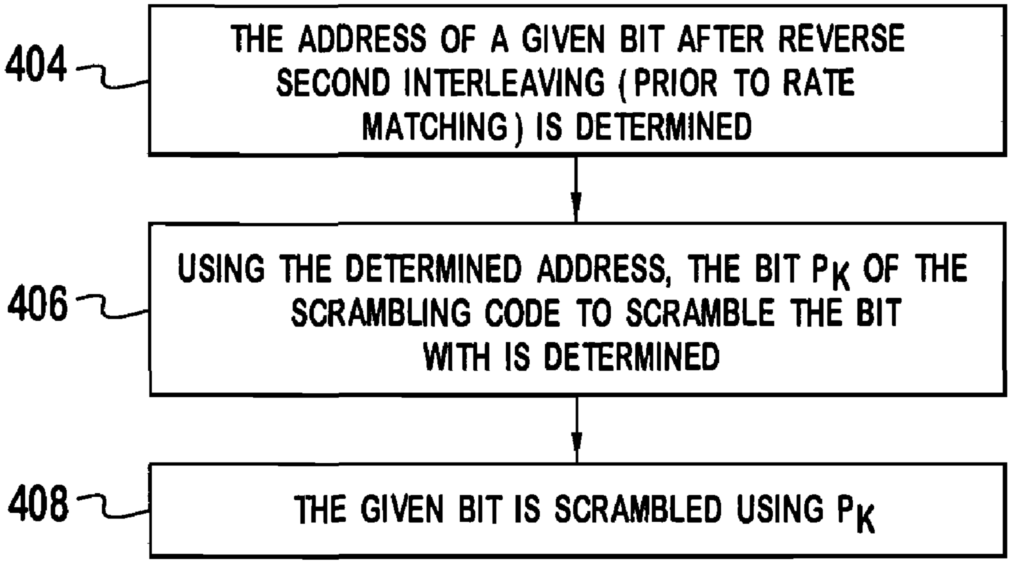
FIG. 28 is a flow chart of the alternate embodiment of "pull" bit scrambling.
Figure 27:
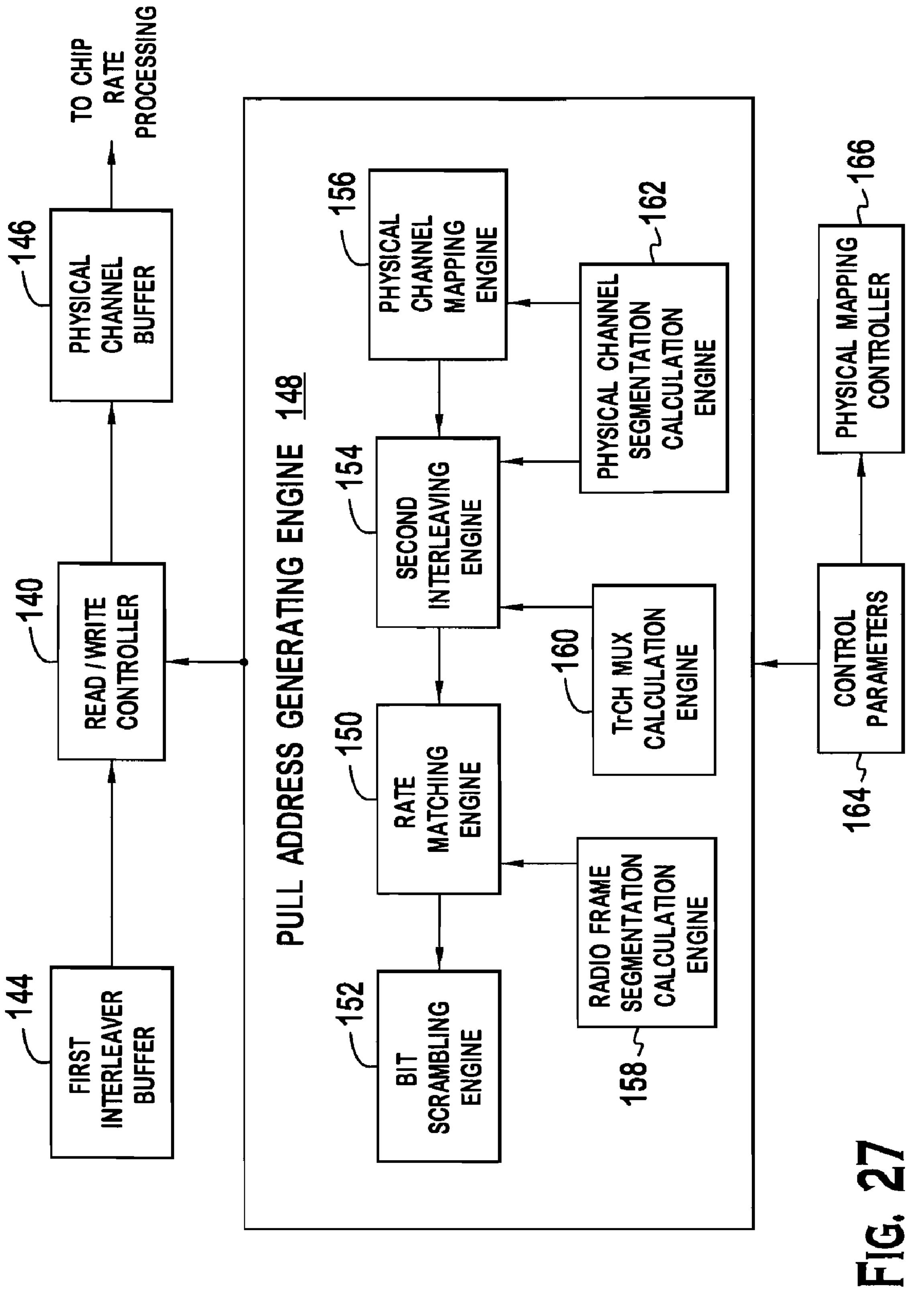
FIG. 27 is a simplified diagram of an alternate embodiment of the "pull" approach.

Although bit scrambling can be performed prior to reverse rate matching, it is preferably performed after reverse rate matching, as shown in FIG. 27 and described with the flow chart of FIG. 28. This embodiment allows for the all of the address mapping to be performed prior to any manipulation of the value of the bits. The address after reverse second interleaving (prior to reverse rate matching) is determined for a given bit after reverse rate matching (step 404). Using the address of the given bit after reverse second interleaving, the $p_k$ to scramble the bit with is determined (step 406). The given bit is scrambled using the determined $p_k$, such as by exclusive-oring the bit with $p_k$ (step 408).

Although "pull" bit scrambling is described in conjunction with a preferred TDD/CDMA communication system, it can be used in a variety of applications, such as in a UE, base station or Node-B of a TDD/CDMA system.

Figure 29:
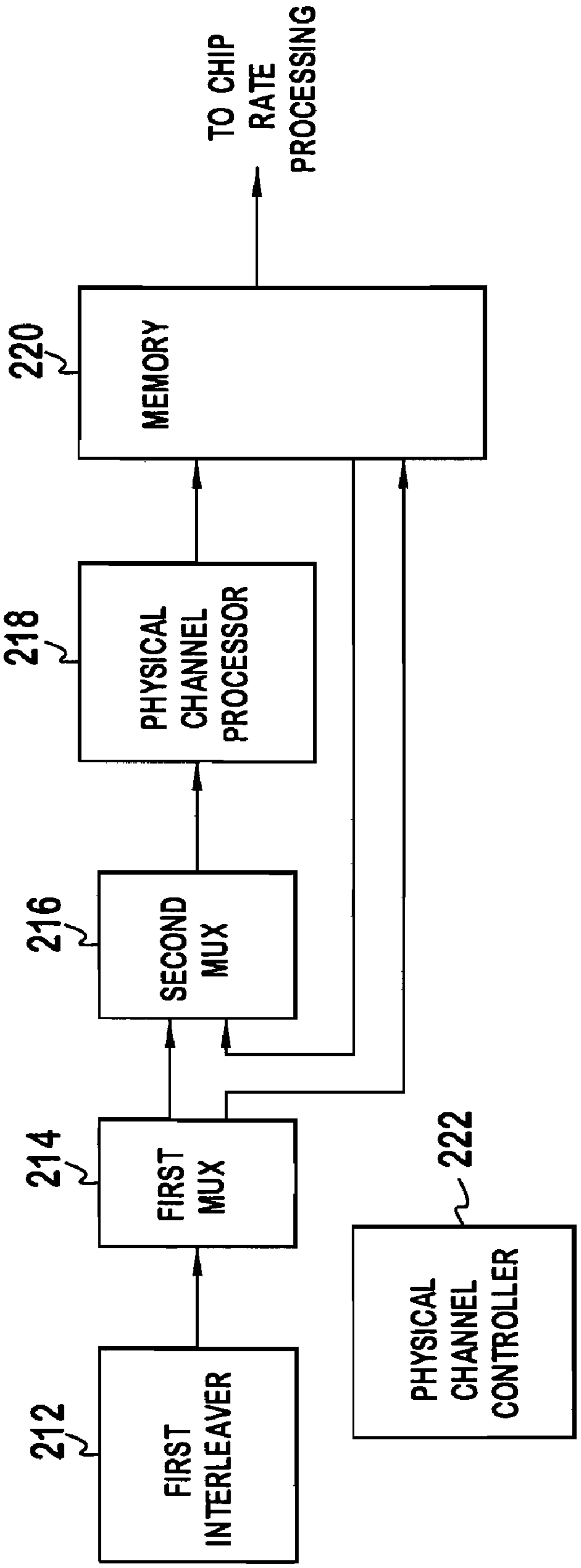
FIG. 29 is a diagram for "reduced first interleaver buffering."

Another approach reduces the first interleaver buffering and is referred to as "reduced first interleaver buffering." FIG. 29 is a block diagram of "reduced first interleaver buffering".

As shown in FIG. 29, the output of the first interleaver 212 is not directly sent to a interleaver buffer. All the physical layer buffering is shown in FIG. 29 as being performed by a single common memory 220. Transport channel data blocks are provided for one frame or multiple frames. This attribute is indicated by the TTI parameter. The TTI can be one of four possible values 10, 20, 40 and 80 ms. A TTI of 10 indicates that the data is for 1 frame, a TTI of 20 indicates 2 frames, a TTI of 40 indicates 4 frames and 80 indicates 8 frames. Data for the first frame of a TTI can be sent directly to the physical channel processor 218. Other frames of the TTI are buffered for later processing. As a result, the overall first interleaver buffering is reduced by one frame. To illustrate, if the TTI is 10 ms., that single frame is stored directly in the physical channel buffer and no first interleaver buffering is required. For a TTI of 80 ms., seven instead of eight frames of data are required to be stored.

The "reduced first interleaver buffering" preferably applies to the "push" approach for physical layer processing. As a result, as data is output from the first interleaver 212, it is written to the corresponding address of the physical channel mapping buffer, although other physical layer processing approaches may be utilized. If a physical layer processing approach is used where intermediate buffering, such as after rate matching and second interleaving, is used in the physical channel processing, reduced interleaver buffering can still be used. The first frame's data is sent directly to physical layer processing and stored in the intermediate buffer.

As shown in FIG. 23, all frames' bits are input into a first MUX 214. The first MUX 214 sends the first frame's bits to a second MUX 216 for physical channel processing, by the physical channel processing block 218. Other frames' bits, if the TTI is greater than 10 ms., are sent to the memory 220 (first interleaver buffer) via the first MUX 214. After the first frame's bits are sent to chip rate processing for transmission over the air interface. Subsequent frame's bits are taken from the memory 230 via the second MUX 216 for physical channel processing. All of these operations are overseen by a physical channel controller 222.

Figure 30A:
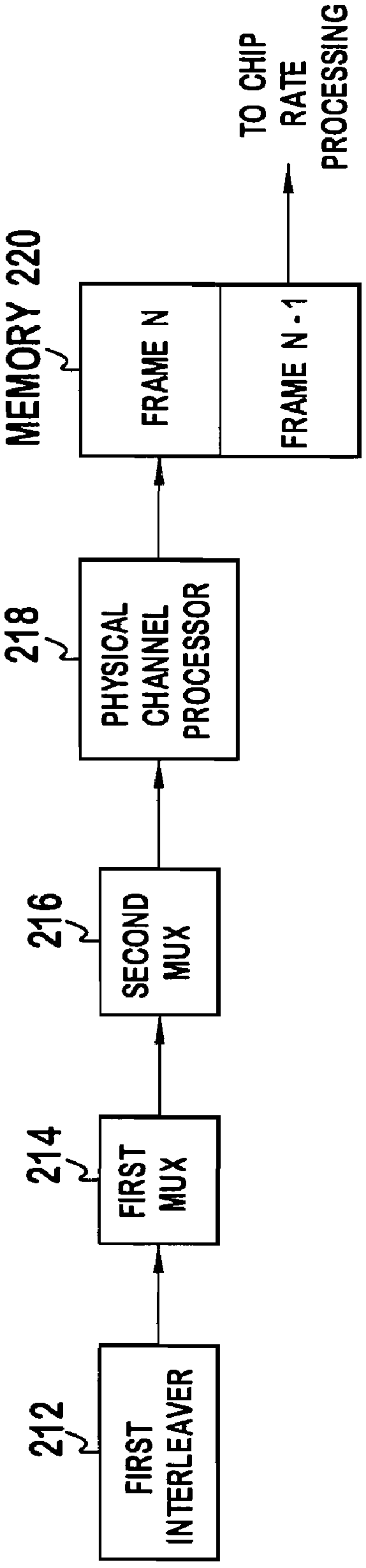
FIGS. 30A and 30B are examples of "reduced first interleaver buffering" for a TTI of 10 ms.
Figure 30B:
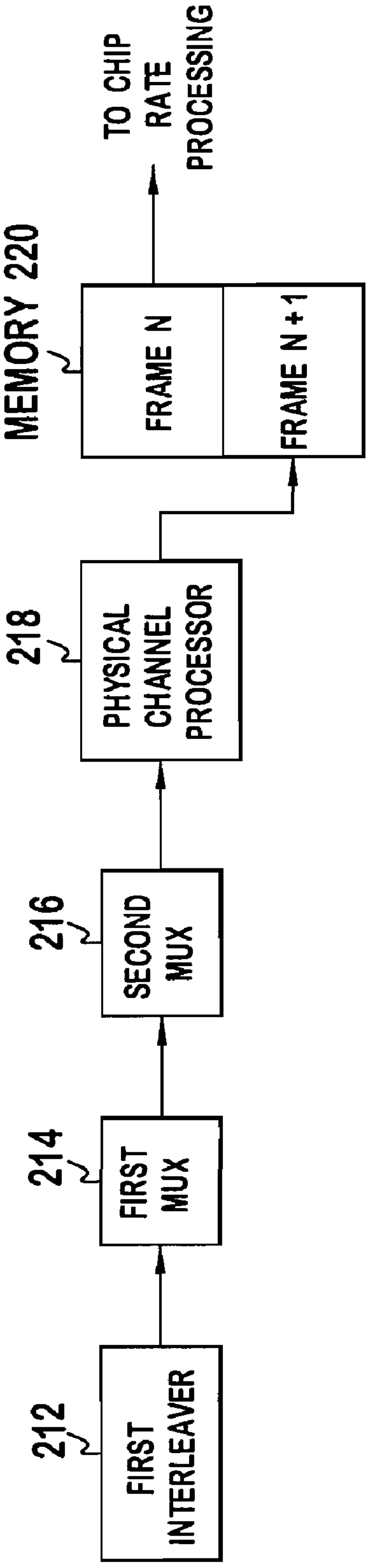

FIGS. 30A and 30B illustrate "reduced first interleaver buffering" data flow for a transport channel data block of 10 ms TTI (one frame). The transport channel data bits are sent directly to the physical channel processor 218 and then to the physical channel buffer for subsequent chip rate processing without the use of the first interleaver buffer. As shown in FIG. 30A, Frame N is sent directly to the physical channel processor 218. As shown in FIG. 30B, the next frame (Frame N+1) is also sent directly to the physical channel processor 218.

Figure 31:
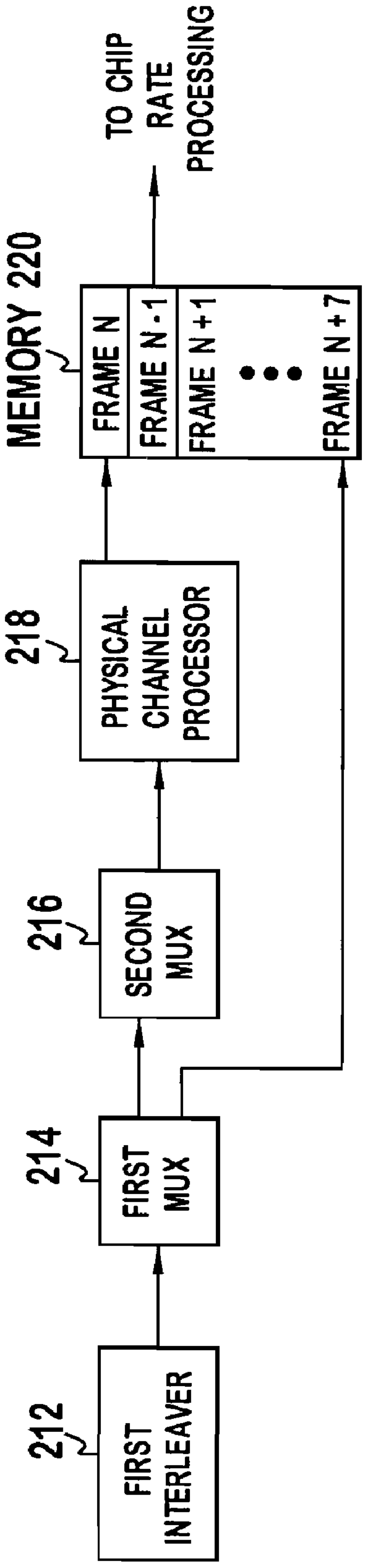
FIGS. 31A and 31B are examples of "reduces first interleaver buffering" for a TTI of 80 ms.
Figure 31:
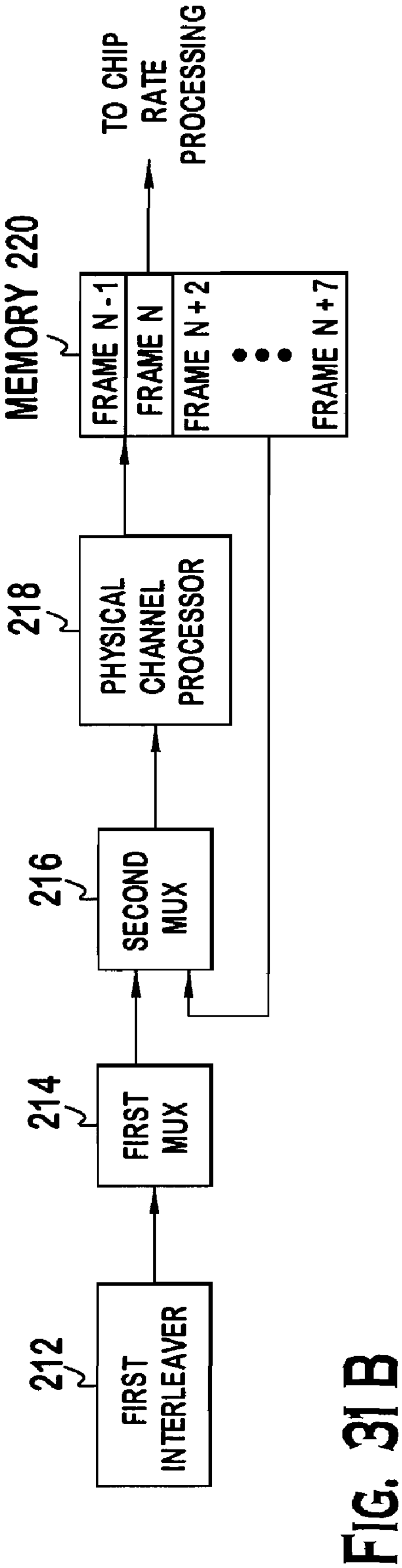

FIGS. 31A and 31B illustrate "reduced first interleaver buffering" data flow for a transport channel data block of 80 ms TTI. The transport channel data for the first frame (Frame N) is sent to physical layer processing and stored in the physical channel buffer (memory 220). The other frames (Frames N+1 to N+7) are stored in the physical channel buffer bypassing the physical layer processing. In the next frame as shown in FIG. 31B, (Frame N+1) is sent to physical layer processing and stored in the physical channel buffer. The other frames (Frames N+2 to N+7) are processed sequentially in the same manner during the next six frames. The chip rate processor is reading data bits from the physical channel buffer one frame behind the current frame. For example, if the physical layer processor is processing (Frame N+1) then the chip rate processor is reading Frame N. The processing approach for data with a TTI of 20 and 40 ms is the same as the 80 ms approach which was described above. The only difference is the number of frames that are buffered, prior to physical channel buffering.

What is claimed is:

1. A method implemented in a user equipment for determining an address for a bit after second interleaving, the method comprising:

using an address of the bit prior to second interleaving to determine a column and row of the bit in a non-permuted array using a known number of columns in the non-permuted array;

determining a permuted column in a permuted array based on the determined column in the non-permuted array; and using a known number of bits to be interleaved, the determined permuted column and the determined row to determine an address of the bit after second interleaving.

2. The method of claim 1 wherein the determined row is determined by dividing the address of the bit prior to second interleaving by the known number of columns.

3. The method of claim 2 wherein the determined column is determined using a remainder of the dividing.

4. A user equipment for use in determining addresses for a bit after second interleaving, the user equipment comprising:

a second interleaver engine configured for using an address of the bit prior to second interleaving, for determining a column and row of the bit in a non-permuted array using a known number of columns in the non-permuted array; for determining a permuted column in a permuted array based on the determined column in the non-permuted array; and for using a known number of bits to be interleaved, the determined permuted column and the determined row, for determining an address of the bit after second interleaving.

5. The user equipment of claim 4 wherein the determined row is determined by dividing the address of the bit prior to second interleaving by the known number of columns.

6. The user equipment of claim 5 wherein the determined column is determined using a remainder of the dividing.

7. A base station for use in determining addresses for a bit after second interleaving, the base station comprising:

a second interleaver engine configured for using an address of the bit prior to second interleaving, for determining a column and row of the bit in a non-permuted array using a known number of columns in the non-permuted array; for determining a permuted column in a permuted array based on the determined column in the non-permuted array; and for using a known number of bits to be interleaved, the determined permuted column and the determined row, for determining an address of the bit after second interleaving.

8. The base station of claim 7 wherein the determined row is determined by dividing the address of the bit prior to second interleaving by the known number of columns.

9. The base station of claim 8 wherein the determined column is determined using a remainder of the dividing.

* * * * *